United States Patent
Toyotaka et al.

(10) Patent No.: US 11,423,855 B2
(45) Date of Patent: Aug. 23, 2022

(54) DISPLAY PANEL, DISPLAY DEVICE, INPUT/OUTPUT DEVICE, AND DATA PROCESSING DEVICE

(71) Applicant: Semiconductor Energy Laboratory Co., Ltd., Atsugi (JP)

(72) Inventors: Kouhei Toyotaka, Atsugi (JP); Kei Takahashi, Isehara (JP); Koji Kusunoki, Isehara (JP); Kazunori Watanabe, Machida (JP); Susumu Kawashima, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 123 days.

(21) Appl. No.: 16/771,246

(22) PCT Filed: Dec. 11, 2018

(86) PCT No.: PCT/IB2018/059850
§ 371 (c)(1),
(2) Date: Jun. 10, 2020

(87) PCT Pub. No.: WO2019/123101
PCT Pub. Date: Jun. 27, 2019

(65) Prior Publication Data
US 2021/0174757 A1    Jun. 10, 2021

(30) Foreign Application Priority Data
Dec. 22, 2017 (JP) .............. JP2017-245780

(51) Int. Cl.
*G06F 3/041* (2006.01)
*G09G 3/36* (2006.01)
*G02F 1/1368* (2006.01)

(52) U.S. Cl.
CPC ........... *G09G 3/3648* (2013.01); *G06F 3/041* (2013.01); *G02F 1/13685* (2021.01); *G09G 2310/0243* (2013.01); *G09G 2354/00* (2013.01)

(58) Field of Classification Search
CPC ........ G09G 3/3648; G09G 2310/0243; G09G 2354/00; G09G 2300/0852; G09G 3/3659;
(Continued)

(56) References Cited

U.S. PATENT DOCUMENTS 7,271,784 B2    9/2007 Koyama
7,382,342 B2    6/2008 Uchino et al.
(Continued)

FOREIGN PATENT DOCUMENTS

CN    001573886 A    2/2005
CN    001729499 A    2/2006
(Continued)

OTHER PUBLICATIONS

Chinese Office Action (Application No. 201880077024.3), dated Nov. 1, 2021.
(Continued)

*Primary Examiner* — Temesghen Ghebretinsae
*Assistant Examiner* — Karin Kiyabu
(74) *Attorney, Agent, or Firm* — Robinson Intellectual Property Law Office; Eric J. Robinson

(57) ABSTRACT

A novel display panel that is highly convenient or reliable is provided. A pixel circuit includes a first switch, a node, a capacitor, and a second switch. The first switch includes a first terminal to which a first signal is supplied and a second terminal electrically connected to the node. The capacitor includes a first terminal electrically connected to the node and a second terminal electrically connected to the second
(Continued)

switch. The second switch includes a first terminal to which a second signal is supplied and a second terminal electrically connected to the second terminal of the capacitor. In addition, the second switch has a function of changing from a non-conducting state to a conducting state when the first switch is in a non-conducting state and a function of changing from a conducting state to a non-conducting state when the first switch is in a non-conducting state. The display element performs display on the basis of a potential of the node.

3 Claims, 15 Drawing Sheets

(58) Field of Classification Search
CPC ......... G09G 3/36; G06F 3/041; G06F 3/0412; G02F 1/13685; H01L 27/32; H01L 51/50; G09F 9/30
See application file for complete search history.

(56) References Cited

U.S. PATENT DOCUMENTS

| | | | |
|---|---|---|---|
| 7,928,945 | B2 | 4/2011 | Kimura et al. |
| 8,159,479 | B2 | 4/2012 | Uchino et al. |
| 8,643,591 | B2 | 2/2014 | Kimura et al. |
| 8,836,678 | B2 | 9/2014 | Uchino et al. |
| 8,878,756 | B2 | 11/2014 | Yamanaka |
| 9,076,384 | B2 | 7/2015 | Uchino et al. |
| 9,147,358 | B2 | 9/2015 | Uchino et al. |
| 9,196,197 | B2 | 11/2015 | Kim |
| 9,257,082 | B2 | 2/2016 | Kimura et al. |
| 9,570,007 | B2 | 2/2017 | Uchino et al. |
| 9,911,383 | B2 | 3/2018 | Uchino et al. |
| 10,134,912 | B2 | 11/2018 | Kimura et al. |
| 10,170,041 | B2 | 1/2019 | Uchino et al. |
| 10,700,215 | B2 | 6/2020 | Kimura et al. |
| 11,069,817 | B2 | 7/2021 | Kimura et al. |
| 2004/0207578 | A1 | 10/2004 | Koyama |
| 2004/0263440 | A1 | 12/2004 | Kimura et al. |
| 2005/0012736 | A1 | 1/2005 | Uchino et al. |
| 2008/0273024 | A1 | 11/2008 | Koyama |
| 2011/0279427 | A1 | 11/2011 | Umezaki et al. |
| 2014/0183528 | A1* | 7/2014 | Endo ................ H01L 27/124 257/43 |
| 2015/0171156 | A1 | 6/2015 | Miyake |
| 2015/0346866 | A1* | 12/2015 | Kusunoki ........... G06F 3/04166 345/174 |
| 2016/0210916 | A1* | 7/2016 | Jeong ................. G09G 3/3614 |
| 2017/0025080 | A1 | 1/2017 | Aoki |
| 2019/0130829 | A1 | 5/2019 | Uchino et al. |
| 2021/0343877 | A1 | 11/2021 | Kimura et al. |

FOREIGN PATENT DOCUMENTS

| | | | |
|---|---|---|---|
| CN | 101903934 A | | 12/2010 |
| CN | 105590611 A | | 5/2016 |
| EP | 1577869 A | | 9/2005 |
| EP | 2239723 A | | 10/2010 |
| JP | 09-054309 A | | 2/1997 |
| JP | 2002-214645 A | | 7/2002 |
| JP | 2002214645 A | * | 7/2002 |
| JP | 2004-341314 A | | 12/2004 |
| JP | 2004-361585 A | | 12/2004 |
| JP | 2005-070110 A | | 3/2005 |
| JP | 2005070110 A | * | 3/2005 |
| JP | 2011-257746 A | | 12/2011 |
| KR | 2004-0104399 A | | 12/2004 |
| KR | 10-1046415 | | 7/2011 |
| KR | 2011-0126039 A | | 11/2011 |
| KR | 2015-0049121 A | | 5/2015 |
| WO | WO-2004/055773 | | 7/2004 |

OTHER PUBLICATIONS

International Search Report (Application No. PCT/IB2018/059850) dated Mar. 12, 2019.
Written Opinion (Application No. PCT/IB2018/059850) dated Mar. 12, 2019.

* cited by examiner

FIG. 9B1     FIG. 9B2     FIG. 9B3

DISPLAY PANEL, DISPLAY DEVICE, INPUT/OUTPUT DEVICE, AND DATA PROCESSING DEVICE

TECHNICAL FIELD

One embodiment of the present invention relates to a display panel, a display device, an input/output device, or a data processing device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

There is known a light-emitting device which includes a transistor including a first gate and a second gate overlapping with each other with a semiconductor film therebetween, a first capacitor maintaining a potential difference between one of a source and a drain of the transistor and the first gate, a second capacitor maintaining a potential difference between one of the source and the drain of the transistor and the second gate, a switch controlling a conduction state between the second gate of the transistor and a wiring, and a light-emitting element to which a drain current of the transistor is supplied (Patent Document 1).

REFERENCE

Patent Document

[Patent Document 1] Japanese Published Patent Application No. 2015-132816

SUMMARY OF THE INVENTION

Problems to be Solved by the Invention

An object of one embodiment of the present invention is to provide a novel display panel that is highly convenient or reliable. Alternatively, an object is to provide a novel display device that is highly convenient or reliable. Alternatively, an object is to provide a novel input/output device that is highly convenient or reliable. Alternatively, an object is to provide a novel data processing device that is highly convenient or reliable. Alternatively, an object is to provide a novel display panel, a novel display device, a novel input/output device, a novel data processing device, or a novel semiconductor device.

Note that the description of these objects does not disturb the existence of other objects. One embodiment of the present invention does not need to achieve all of these objects. Other objects will be apparent from and can be derived from the description of the specification, the drawings, the claims, and the like.

Means for Solving the Problems (1) One embodiment of the present invention is a display panel including a pixel 702($i$, $j$).

The pixel 702($i$, $j$) includes a pixel circuit 530($i$, $j$) and a display element 750($i$, $j$).

The pixel circuit 530($i$, $j$) includes a first switch SW11, a node N1($i$, $j$), a capacitor C12, and a second switch SW12.

The first switch SW11 includes a first terminal to which a first signal is supplied, and the first switch SW11 includes a second terminal electrically connected to the node N1($i$, $j$).

The capacitor C12 includes a first terminal electrically connected to the node N1($i$, $j$).

The second switch SW12 includes a first terminal to which a second signal is supplied, and the second switch SW12 includes a second terminal electrically connected to a second terminal of the capacitor C12. Furthermore, the second switch SW12 has a function of changing from a non-conducting state to a conducting state when the first switch SW11 is in a non-conducting state, and the second switch SW12 has a function of changing from a conducting state to a non-conducting state when the first switch SW11 is in a non-conducting state.

The display element 750($i$, $j$) performs display on the basis of a potential VN of the node N1($i$, $j$).

Thus, the potential of the node N1($i$, $j$) can be controlled using the first switch SW11 and the second switch SW12. Alternatively, the potential of the node N1($i$, $j$) can be controlled using the first switch SW11 and can be changed using the second switch SW12. Alternatively, the changing potential can be supplied to the display element 750($i$, $j$). Alternatively, display can be performed in accordance with the changing potential. Alternatively, the display of the display element 750($i$, $j$) can be changed. Alternatively, an operation of the display element 750($i$, $j$) can be emphasized. Alternatively, the response of the display element 750($i$, $j$) can be made faster. As a result, a novel display panel that is highly convenient or reliable can be provided.

(2) Furthermore, one embodiment of the present invention is the above-described display panel that includes a first driving portion GD.

The first driving portion GD supplies a first selection signal and a second selection signal.

The first selection signal changes from a second level LV2 to a first level LV1 in a period when the second selection signal is at a fourth level LV4, and the second selection signal changes from the fourth level LV4 to a third level LV3 twice or more in a period when the first selection signal is at the first level LV1.

The first switch SW11 is controlled on the basis of the first selection signal, the first switch SW11 is brought into a conducting state when the first selection signal is at the second level LV2, and the first switch SW11 is brought into a non-conducting state when the first selection signal is at the first level LV1.

The second switch SW12 is controlled on the basis of the second selection signal, the second switch SW12 is brought into a conducting state when the second selection signal is at the fourth level LV4, and the second switch SW12 is brought into a non-conducting state when the second selection signal is at the third level LV3.

Thus, the potential of the node N1($i$, $j$) can be controlled using the first switch SW11. Alternatively, a change in the potential of the node N1(1, $j$) can be promoted or emphasized temporarily using the second switch SW12. As a result, a novel display panel that is highly convenient or reliable can be provided.

(3) Furthermore, one embodiment of the present invention is a display panel in which the above-described pixel circuit 530(i, j) includes a first transistor.

The first transistor includes a first semiconductor film 508(1).

The first driving portion GD includes a second transistor MG. The second transistor MG includes a second semiconductor film 508(2), and the second semiconductor film 508(2) can be formed through the same process as that for forming the first semiconductor film 508(1).

Thus, the driving portion GD can be formed over a substrate over which the pixel circuit 530(i, j) is formed. Alternatively, the number of components of the display panel can be reduced. Alternatively, the manufacturing process of the display panel can be simplified. As a result, a novel display panel that is highly convenient or reliable can be provided.

(4) Furthermore, one embodiment of the present invention is the above-described display panel that includes a second driving portion SD.

The second driving portion SD supplies the first signal and the second signal.

The second signal includes a first level LV5 and a second level LV6, the second signal changes from the first level LV5 to the second level LV6 or from the second level LV6 to the first level LV5 when the first selection signal is at the first level LV1 and the second selection signal is at the fourth level LV4.

The potential VN of the node N1(i, j) changes on the basis of a potential difference between the first level LV5 and the second level LV6 and the first signal.

Thus, the potential of the node N1(i, j) can be controlled using the first signal and the second signal. Alternatively, the potential of the node N1(i, j) can be determined using the first signal and can be changed using the second signal. Alternatively, the potential of the node N1(i, j) can be determined using the first signal and can be temporarily changed using the second signal. Alternatively, a change in the potential of the node N1(i, j) can be emphasized using the second signal. Alternatively, the first signal and the first signal to which the potential difference between the first level LV5 and the second level LV6 is added can be supplied to the display element. As a result, a novel display panel that is highly convenient or reliable can be provided.

(5) Furthermore, one embodiment of the present invention is a display panel in which the above-described second driving portion SD includes a first driver circuit DC21 and a second driver circuit DC22.

The first driver circuit DC21 generates the first signal, and the second driver circuit DC22 generates the second signal.

Thus, a conventional driver circuit can be used as the first driver circuit DC21. Alternatively, the performance of the display panel can be improved using the second driver circuit DC22 while the existing resources are utilized. Alternatively, it is possible to concentrate on the development of the second driver circuit DC22. Alternatively, the development period can be shortened. Alternatively, the cost of development can be saved. As a result, a novel display panel that is highly convenient or reliable can be provided.

(6) Furthermore, one embodiment of the present invention is a display panel in which the above-described second driver circuit DC22 includes a third transistor MS.

The third transistor MS includes a third semiconductor film 508(3), and the third semiconductor film 508(3) can be formed through the same process as that for forming the first semiconductor film 508(1).

Thus, the driver circuit DC22 can be formed over the substrate over which the pixel circuit 530(i, j) is formed. Alternatively, the number of components of the display panel can be reduced. Alternatively, the manufacturing process of the display panel can be simplified. As a result, a novel display panel that is highly convenient or reliable can be provided.

(7) Furthermore, one embodiment of the present invention is the above-described display panel that includes a display region 231.

The display region 231 includes one group of pixels 702(i, 1) to 702(i, n), a different group of pixels 702(1, j) to 702(m, j), a first scan line G1(i), a second scan line G2(i), a first signal line S1(j), and a second signal line S2(j).

The one group of pixels 702(i, 1) to 702(i, n) include the pixel 702(i, j), and the one group of pixels 702(i, 1) to 702(i, n) are provided in a row direction.

The different group of pixels 702(1, j) to 702(m, j) include the pixel 702(i, j), and the different group of pixels 702(1, j) to 702(m, j) are provided in a column direction that intersects the row direction.

The first scan line G1(i) is electrically connected to the one group of pixels 702(i, 1) to 702(i, n), and the second scan line G2(i) is electrically connected to the one group of pixels 702(i, 1) to 702(i, n).

The first signal line S1(j) is electrically connected to the different group of pixels 702(1, j) to 702(m, j), and the second signal line S2(1) is electrically connected to the different group of pixels 702(1, j) to 702(m, j).

Thus, image data can be supplied to a plurality of pixels. Alternatively, the second selection signal can be supplied on the row basis, independently of the first selection signal. Alternatively, the second signal can be supplied on the column basis, independently of the first signal. Alternatively, as a result, a novel display panel that is highly convenient or reliable can be provided.

(8) Furthermore, one embodiment of the present invention is a display panel in which the above-described display region 231 is provided between the first driver circuit DC21 and the second driver circuit DC22.

The first signal line S1(j) is electrically connected to the first driver circuit DC21, and the second signal line S2(j) is electrically connected to the second driver circuit DC22.

Thus, the display region 231 can be closer to the first driver circuit DC21. Alternatively, the display region 231 can be closer to the first driver circuit DC22. Alternatively, degradation of the first signal can be prevented. Alternatively, degradation of the second signal can be prevented. As a result, a novel display panel that is highly convenient or reliable can be provided.

(9) Furthermore, one embodiment of the present invention is the above-described display panel in which the above-described second driving portion SD includes a third driver circuit DC23.

The third driver circuit DC23 generates the second signal.

The display region 231 is provided between the second driver circuit DC22 and the third driver circuit DC23.

The second signal line S2(j) is electrically connected to the third driver circuit DC23.

Thus, the load derived from the different group of pixels 702(1, j) to 702(m, j) and the second signal line S2(j) can be divided between the second driver circuit DC22 and the third driver circuit DC23. Alternatively, the different group of pixels 702(1, j) to 702(m, j) and the second signal line S2(j) can be driven using the second driver circuit DC22 and the third driver circuit DC23. Alternatively, the time taken for the potentials of the different group of pixels 702(1, j) to 702(m, j) and the potential of the second signal line S2(j) to reach a predetermined value can be shortened. Alternatively, an operation can be performed at high speed. Alternatively, as a result, a novel display panel that is highly convenient or reliable can be provided.

(10) Furthermore, one embodiment of the present invention is a display device that includes the above-described display panel and a control portion 238.

Image data V1 and control data CI are supplied to the control portion 238, the control portion 238 generates data V11 on the basis of the image data V1, the control portion 238 generates a control signal SP on the basis of the control data CI, and the control portion 238 supplies the data V11 and the control signal SP.

The data V11 and the control signal SP are supplied to the display panel.

The first driving portion GD operates on the basis of the control signal SP, the second driving portion SD operates on the basis of the control signal SP, and the pixels perform display on the basis of the data V11.

Thus, the image data can be displayed using the display element. As a result, a novel display device that is highly convenient or reliable can be provided.

(11) Furthermore, one embodiment of the present invention is an input/output device that includes an input portion 240 and a display portion 230.

The display portion 230 includes the above-described display panel, and the input portion 240 includes a sensing region 241.

The input portion 240 senses an object approaching the sensing region 241, and the sensing region 241 includes a region overlapping with the pixel 702(i, j).

Thus, the object approaching the region overlapping with the display portion can be sensed while image data is displayed using the display portion. Alternatively, positional data can be input using a finger or the like that approaches the display portion as a pointer. Alternatively, positional data can be associated with image data displayed on the display portion. As a result, a novel input/output device that is highly convenient or reliable can be provided.

(12) Furthermore, one embodiment of the present invention is a data processing device that includes one or more of a keyboard, a hardware button, a pointing device, a touch sensor, an illuminance sensor, an imaging device, an audio input device, an eye-gaze input device, and an attitude detection device, and the above-described display panel.

Although the block diagram in which components are classified by their functions and shown as independent blocks is shown in the drawings attached to this specification, it is difficult to completely divide actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above-described semiconductor film. Similarly, a drain of a transistor means a drain region that is part of the above-described semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

With one embodiment of the present invention, a novel display panel that is highly convenient or reliable can be provided. Alternatively, a novel display device that is highly convenient or reliable can be provided. Alternatively, a novel input/output device that is highly convenient or reliable can be provided. Alternatively, a novel data processing device that is highly convenient or reliable can be provided. Alternatively, a novel display panel, a novel display device, a novel input/output device, a novel data processing device, or a novel semiconductor device can be provided.

Note that the description of these effects does not disturb the existence of other effects. One embodiment of the present invention does not need to have all of these effects. Other effects will be apparent from and be derived from the description of the specification, the drawings, the claims, and the like.

BRIEF DESCRIPTION OF THE DRAWINGS

FIGS. 9A-9B3 Views showing a display device of an embodiment.

MODE FOR CARRYING OUT THE INVENTION

Figure 1A:
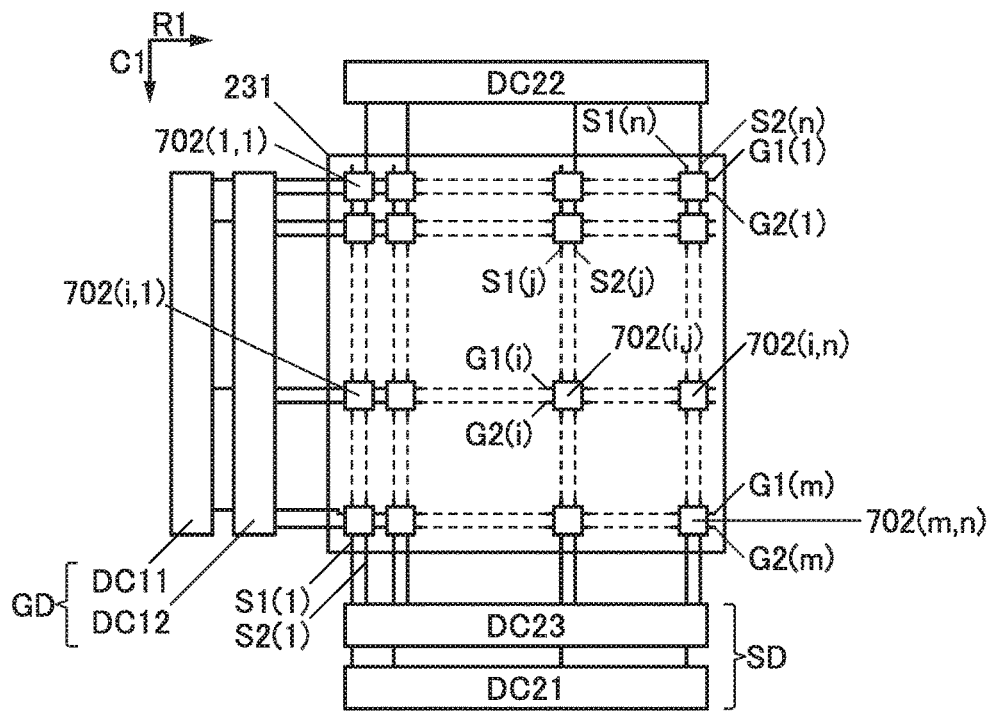
FIGS. 1A-1B A block diagram and a timing chart showing a structure of a display panel of an embodiment.

A display panel of one embodiment of the present invention includes the pixel 702($i$, $j$), and the pixel 702($i$, $j$) includes the pixel circuit 530($i$, $j$) and the display element 750($i$, $j$). The pixel circuit 530($i$, $j$) includes the first switch SW11, the node N1($i$, $j$), the capacitor C12, the second switch and SW12. The first switch SW11 includes the first terminal to which the first signal is supplied and the second terminal electrically connected to the node N1($i$, $j$). The capacitor C12 includes the first terminal electrically connected to the node N1($i$, $j$) and the second terminal electrically connected to the second switch SW12. The second switch SW12 includes the first terminal to which the second signal is supplied. Furthermore, the second switch SW12 is in a conducting state when the first switch SW11 changes from a conducting state to a non-conducting state, has a function of changing from a non-conducting state to a conducting state when the first switch SW11 is in a non-conducting state, and has a function of changing from a conducting state to a non-conducting state when the first switch SW11 is in a non-conducting state; and the display element 750($i$, $j$) performs display on the basis of the potential VN of the node N1($i$, $j$).

Thus, the potential of the node N1($i$, $j$) can be controlled using the first switch SW11 and the second switch SW12. Alternatively, the potential of the node N1($i$, $j$) can be controlled using the first switch SW11 and can be changed using the second switch SW12. Alternatively, the changing potential can be supplied to the display element 750($i$, $j$). Alternatively, display can be performed in accordance with the changing potential. Alternatively, the display of the display element 750($i$, $j$) can be changed. Alternatively, an operation of the display element 750($i$, $j$) can be emphasized. Alternatively, the response of the display element 750($i$, $j$) can be made faster. As a result, a novel display panel that is highly convenient or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description of the following embodiments. Note that in structures of the invention described below, the same portions or portions having similar functions are denoted by the same reference numerals in different drawings, and a description thereof is not repeated.

Embodiment 1

In this embodiment, a structure of a display panel of one embodiment of the present invention will be described with reference to FIG. 1 to FIG. 7.

Figure 1B:
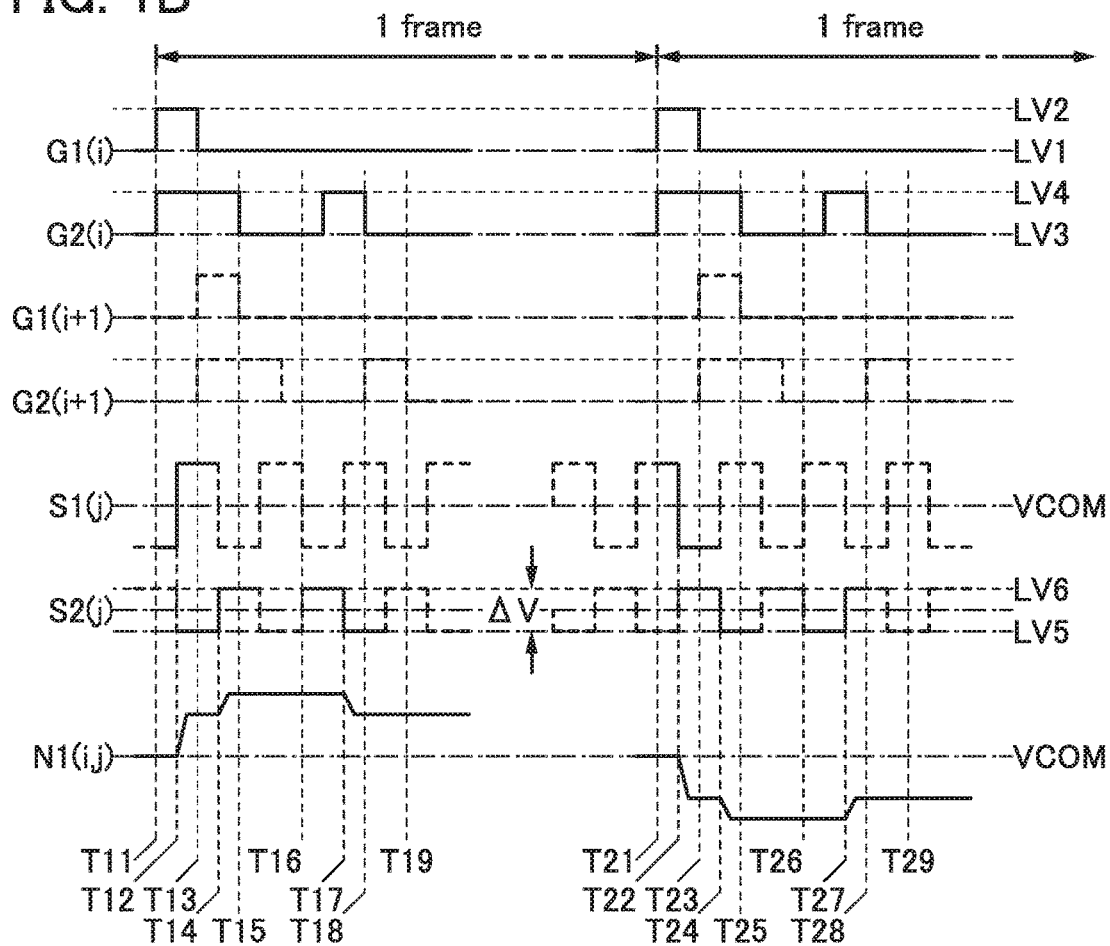
Figure 2:
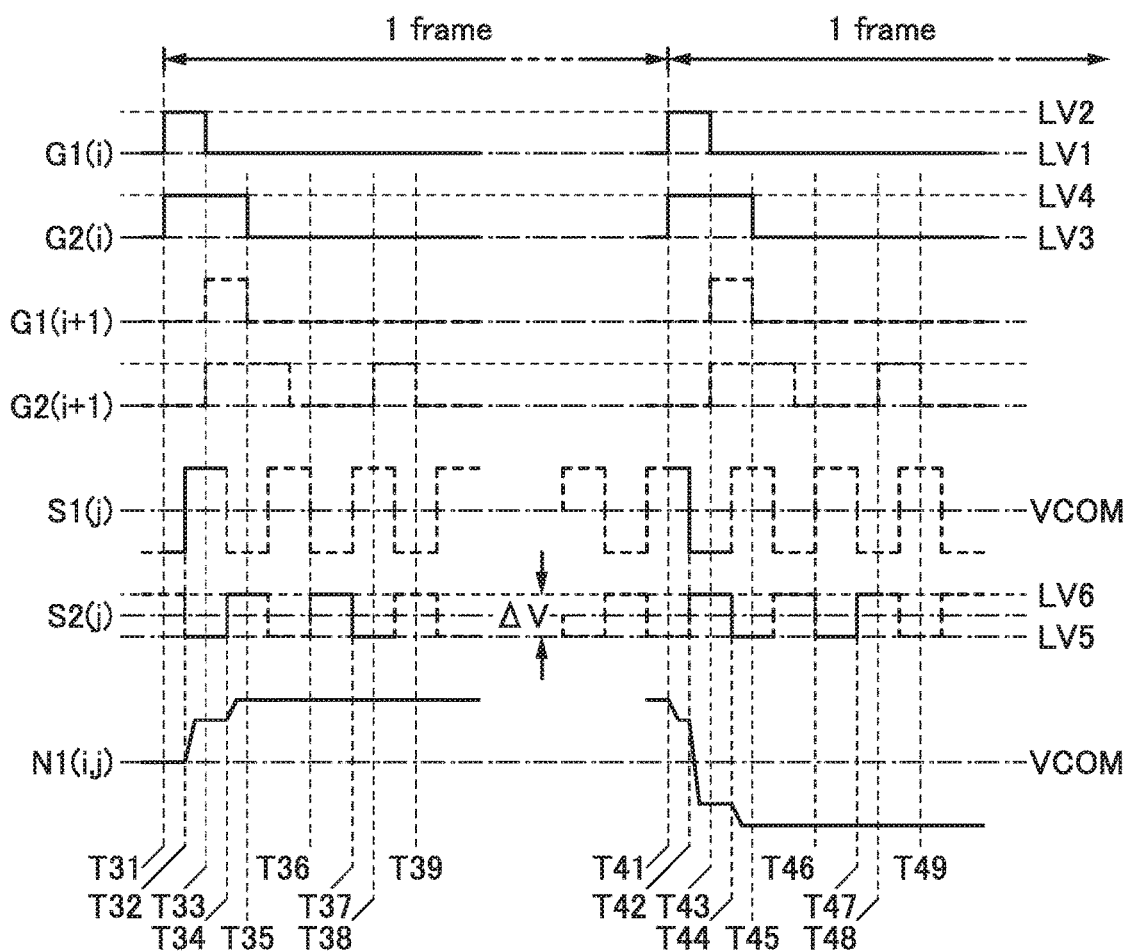
FIG. 2 A timing chart showing a structure of a display panel of an embodiment.

FIG. 1 and FIG. 2 are views showing the structure of the display panel of one embodiment of the present invention. FIG. 1(A) is a top view of the display panel of one embodiment of the present invention, and FIG. 1(B) is a timing chart showing signals. FIG. 2 is a timing chart showing signals different from those in FIG. 1(B).

Figure 3A:
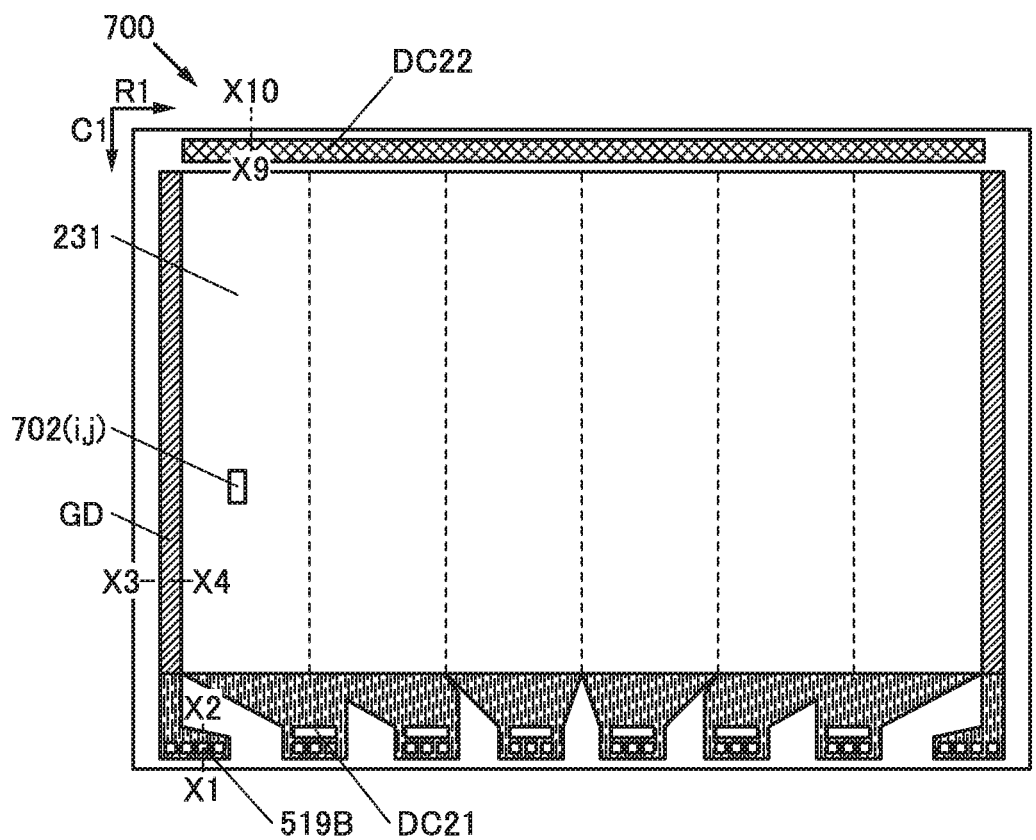
FIGS. 3A-3C Block diagrams showing a structure of a display panel of an embodiment.
Figure 3B:
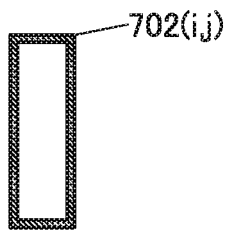
Figure 3C:
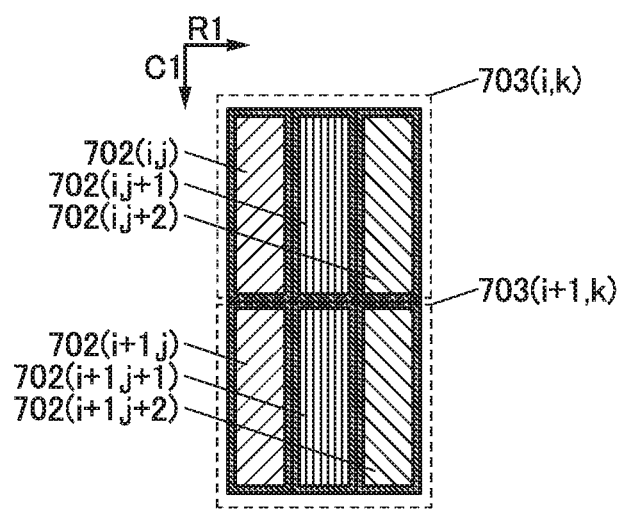

FIG. 3 is a view showing a structure of the display panel of one embodiment of the present invention. FIG. 3(A) is a top view of the display panel of one embodiment of the present invention, and FIGS. 3(B) and 3(C) are top views of pixels.

Figure 4A:
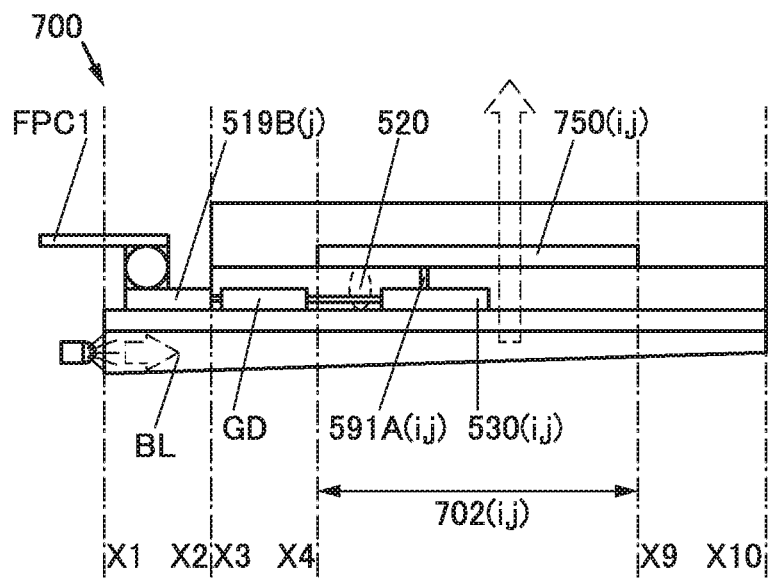
FIGS. 4A-4B A cross-sectional view and a circuit diagram showing a structure of a display panel of an embodiment.
Figure 4B:
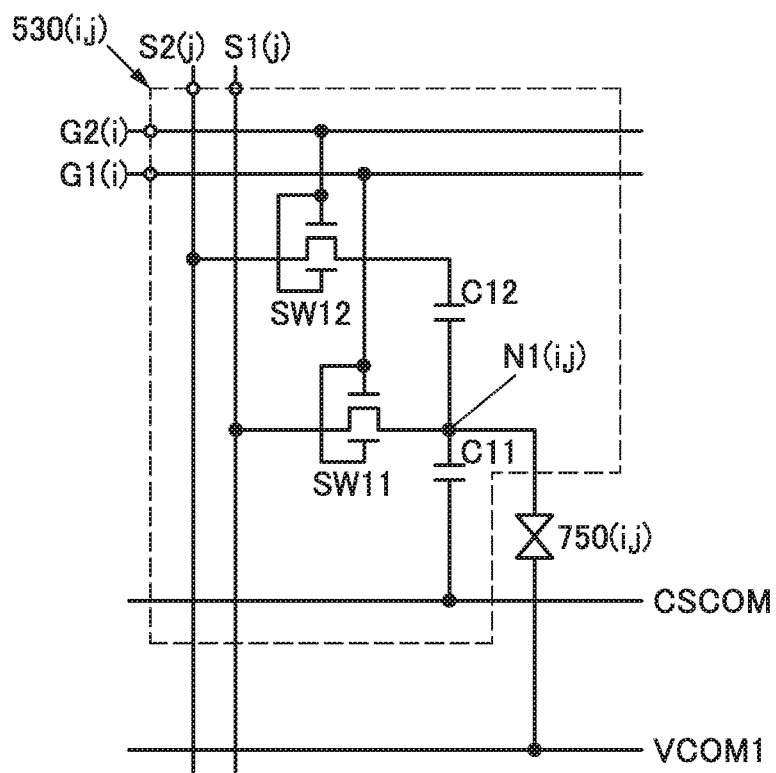

FIG. 4(A) is a cross-sectional view taken along a cutting plane line X1-X2, a cutting plane line X3-X4, and a cutting plane line X9-X10 in FIG. 3(A). FIG. 4(B) is a circuit diagram showing a structure of a pixel circuit included in the display panel.

Figure 5A:
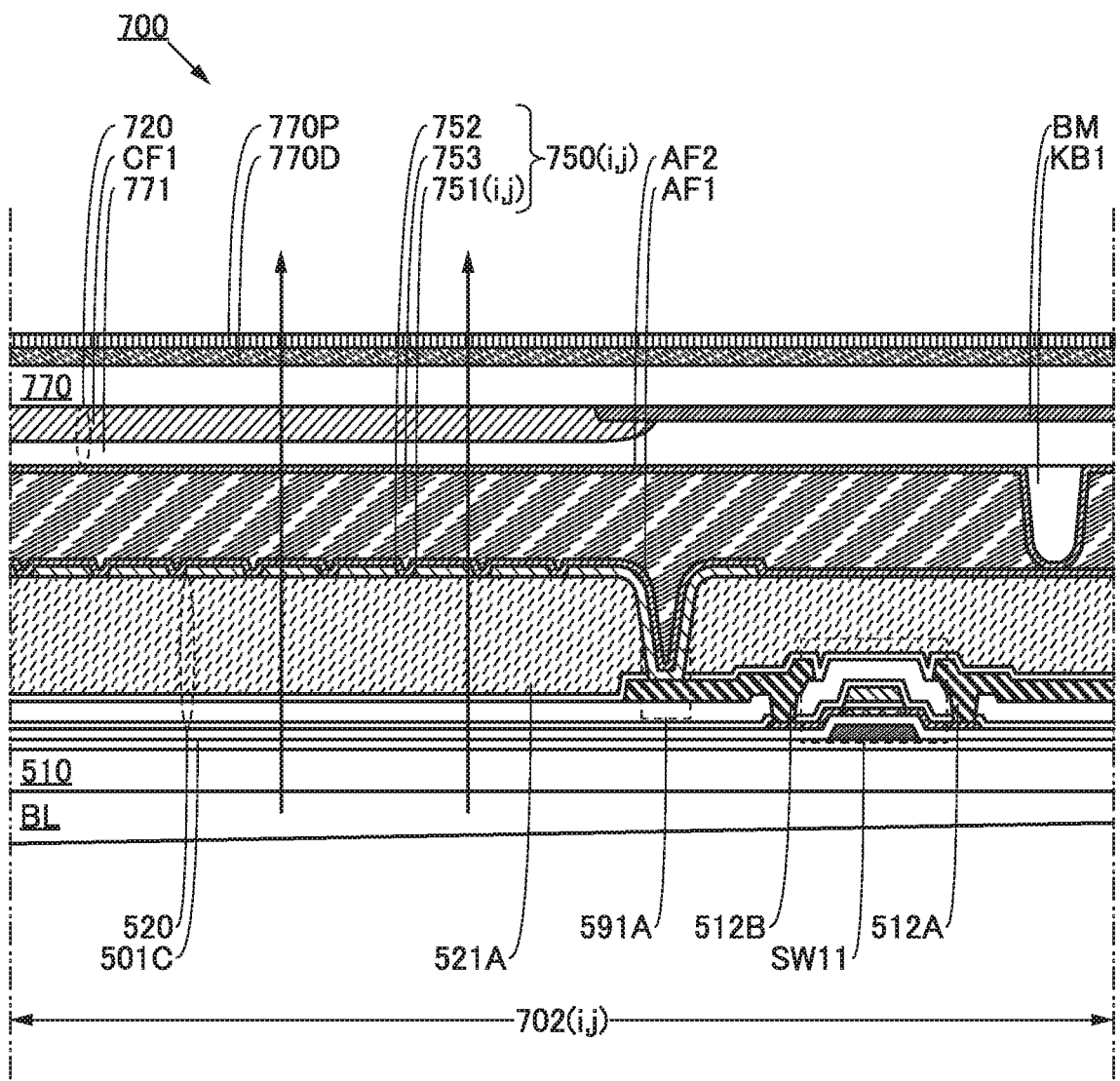
FIGS. 5A-5B Cross-sectional views showing a structure of a display panel of an embodiment.
Figure 5B:
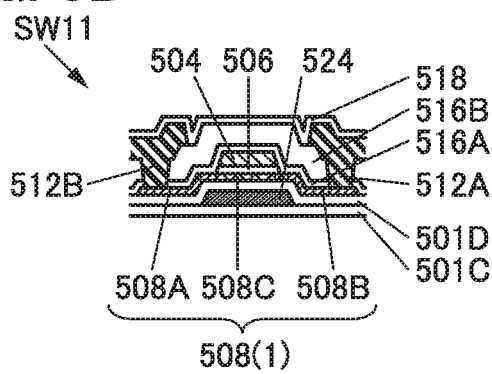

FIG. 5(A) is a view showing a structure of the pixel of the display panel of one embodiment of the present invention. FIG. 5(B) is a cross-sectional view showing part of the pixel illustrated in FIG. 5(A).

Figure 6A:
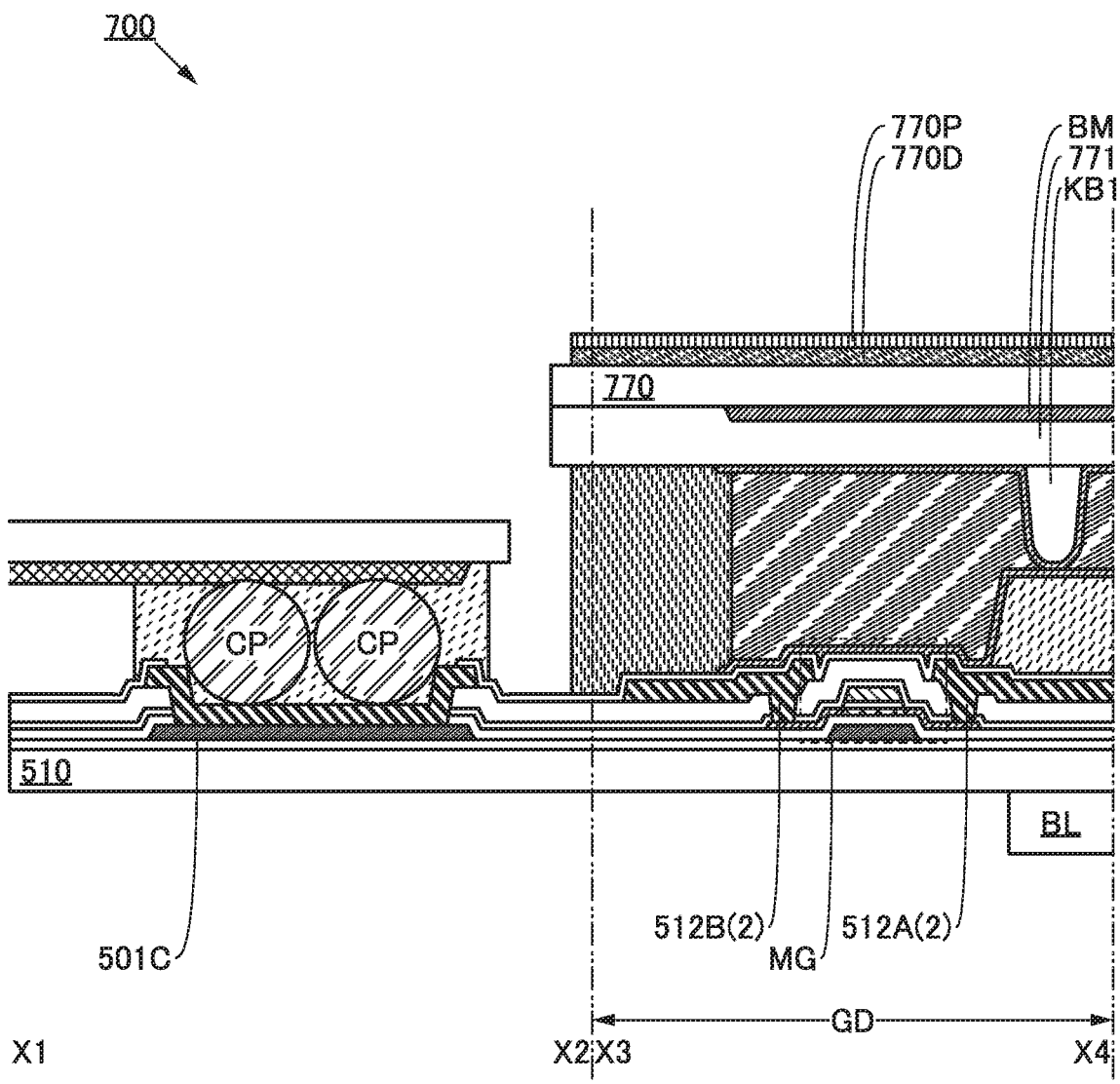
FIGS. 6A-6B Cross-sectional views showing a structure of a display panel of an embodiment.
Figure 6B:
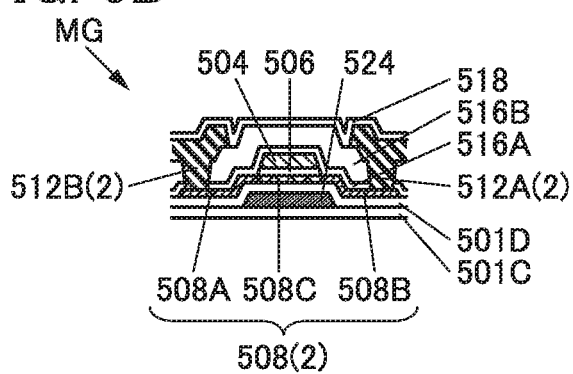

FIG. 6 is a cross-sectional view taken along the cutting plane line X1-X2 and the cutting plane line X3-X4 in FIG. 3(A). Furthermore, FIG. 6(B) is a cross-sectional view showing part of the display panel shown in FIG. 6(A).

Figure 7A:
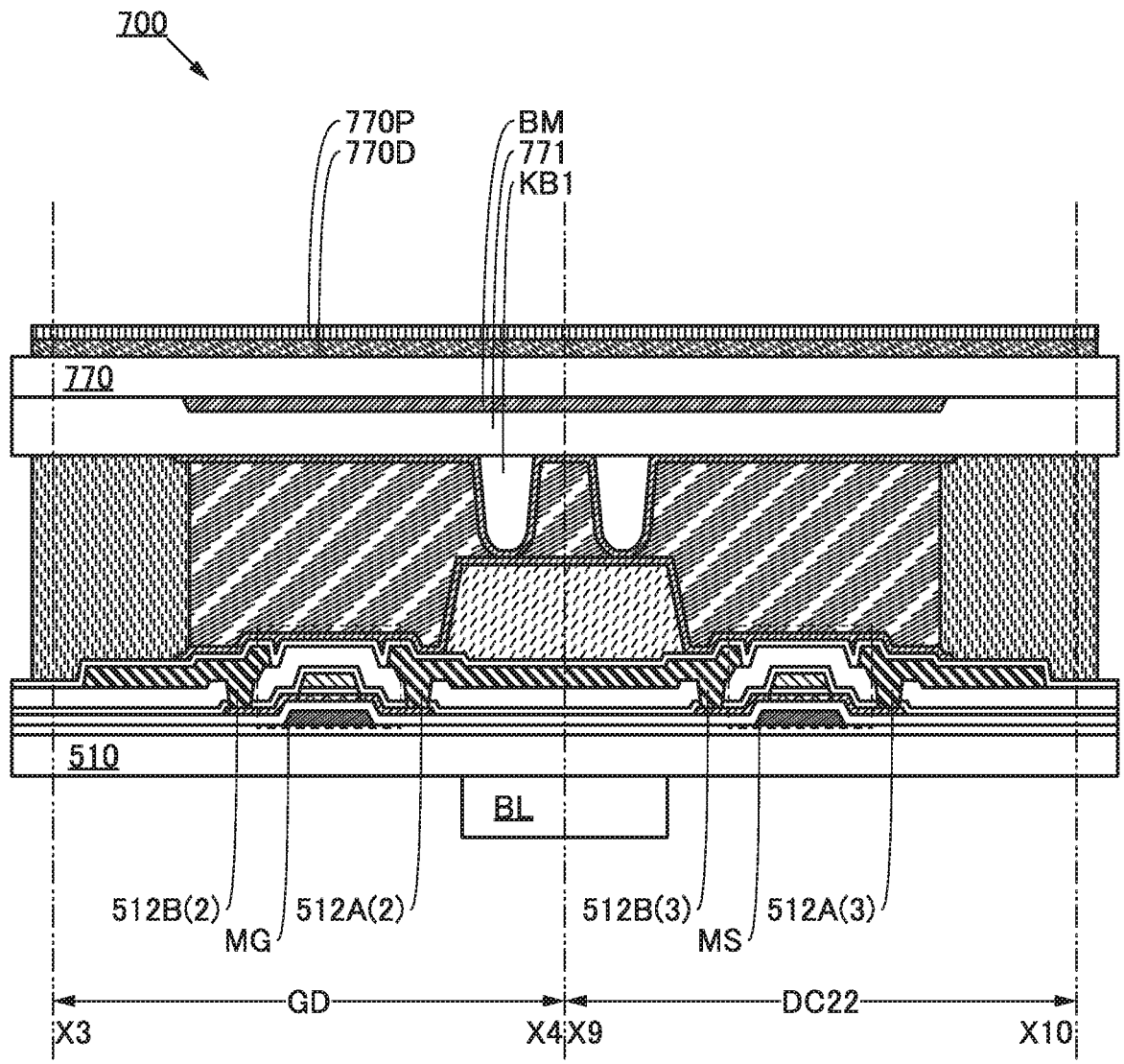
FIGS. 7A-7C Cross-sectional views showing a structure of a display panel of an embodiment.
Figure 7B:
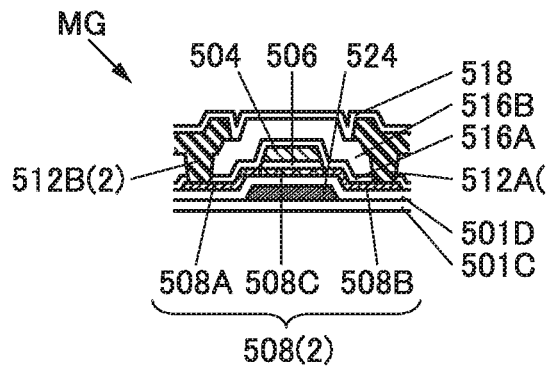

FIG. 7 is a cross-sectional view taken along the cutting plane line X3-X4 and the cutting plane line X9-X10 in FIG. 3(A). FIG. 7(B) is a cross-sectional view showing part of the display panel shown in FIG. 7(A).

Figure 8A:
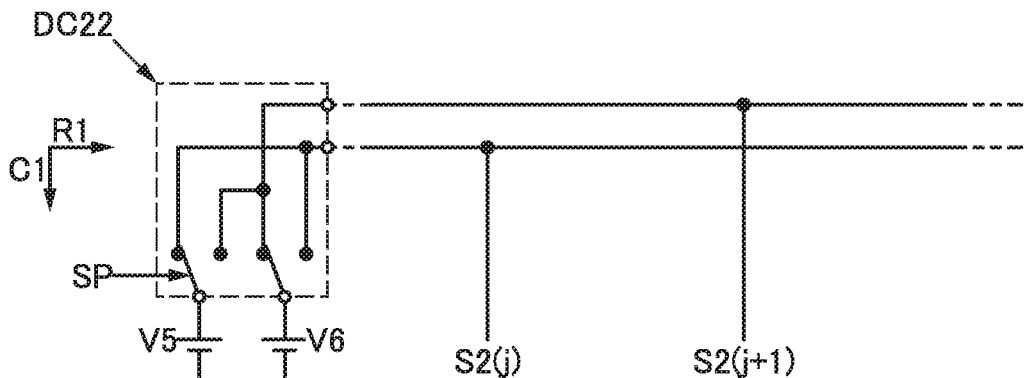
FIGS. 8A-8C Circuit diagrams showing structures of a display panel of an embodiment.
Figure 8B:
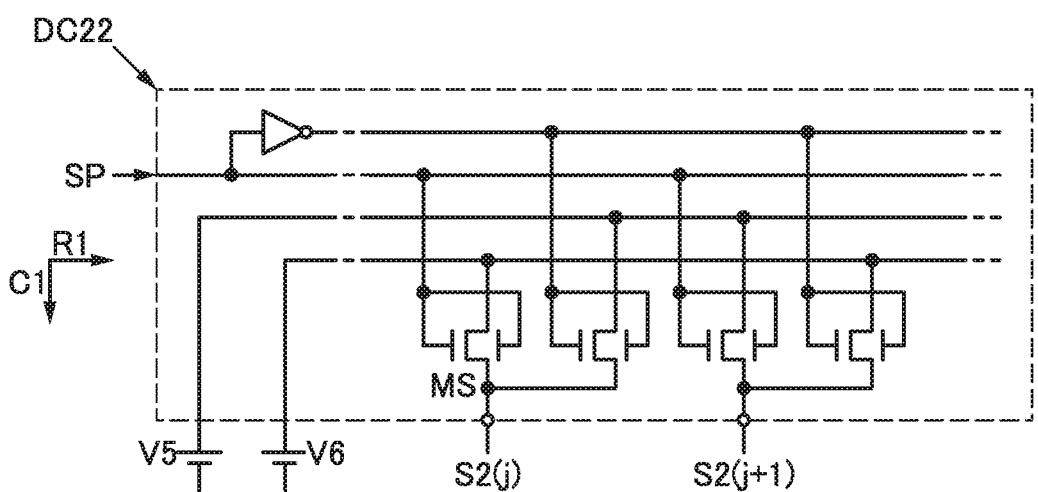
Figure 8C:
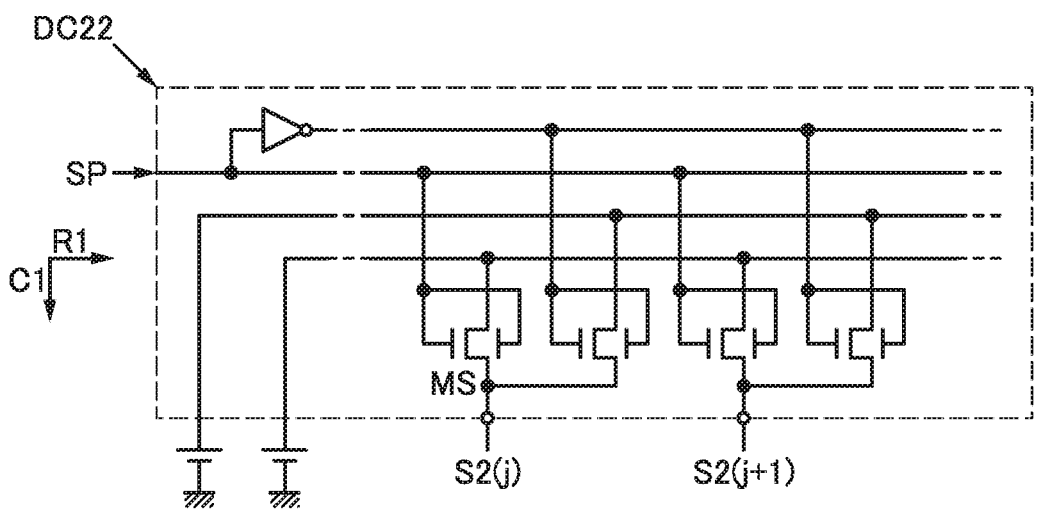

FIG. 8 is a circuit diagram showing part of the structure of the driver circuit of the display panel of one embodiment of the present invention. FIG. 8(B) is a circuit diagram showing a driver circuit having a structure different from that of the driver circuit shown in FIG. 8(A), and FIG. 8(C) is a circuit diagram showing a driver circuit having a structure different from that of the driver circuit shown in FIG. 8(A).

Note that in this specification, an integer variable of 1 or more is sometimes used in reference numerals. For example, (p) where p is an integer variable of 1 or more is sometimes used in part of a reference numeral that specifies any of p components at a maximum. For another example, (m, n) where m and n are each an integer variable of 1 or more is sometimes used in part of a reference numeral that specifies any of m×n components at a maximum.

<Structure Example 1 of Display Panel>

A display panel 700 described in this embodiment includes the pixel 702($i$, $j$) (see FIG. 1(A)).

<<Structure Example 1 of Pixel 702($i$, $j$)>>

The pixel 702($i$, $j$) includes the pixel circuit 530($i$, $j$) and the display element 750($i$, $j$) (see FIG. 4(A)).

<<Structure Example 1 of Pixel Circuit 530($i$, $j$)>>

The pixel circuit 530($i$, $j$) includes the switch SW11, the node N1($i$, $j$), a capacitor C11, the capacitor C12, and the switch SW12 (see FIG. 4(B)).

<<Structure Example 1 of Switch SW11>>

The switch SW11 includes the first terminal to which the first signal is supplied. The switch SW11 also includes the second terminal electrically connected to the node N1(1, j). For example, a transistor can be used as the switch SW11. One of a source electrode and a drain electrode of the transistor can be used as the first terminal, and the other can be used as the second terminal.

<<Structure Example 1 of Capacitor C12>>

The capacitor C12 includes the first terminal electrically connected to the node N1($i$, $j$). The capacitor C12 also includes the second terminal electrically connected to the second terminal of the switch SW12.

<<Structure Example 1 of Switch SW12>>

The switch SW12 includes the first terminal to which the second signal is supplied. The switch SW12 also includes the second terminal electrically connected to the second terminal of the capacitor C12. For example, a transistor can be used as the switch SW12. One of a source electrode and a drain electrode of the transistor can be used as the first terminal, and the other can be used as the second terminal.

The switch SW12 has a function of changing from a non-conducting state to a conducting state when the switch SW11 is in a non-conducting state. Furthermore, the switch SW12 has a function of changing from a conducting state to a non-conducting state when the switch SW11 is in a non-conducting state.

For example, the conduction state of the switch SW11 or the switch SW12, as which the transistor is used, can be controlled with the potential of a gate electrode of the transistor.

<<Structure Example 1 of Capacitor C11>>

The capacitor C11 includes a first electrode electrically connected to the switch SW11 and a second electrode electrically connected to a wiring CSCOM.

<<Structure Example 1 of Display Element 750($i$, $j$)>>

The display element 750($i$, $j$) performs display on the basis of the potential VN of the node N1($i$, $j$).

Thus, the potential of the node N1($i$, $j$) can be controlled using the switch SW11 and the switch SW12. Alternatively, the potential of the node N1($i$, $j$) can be controlled using the switch SW11 and can be changed using the switch SW12. Alternatively, the changing potential can be supplied to the display element 750($i$, $j$). Alternatively, display can be performed in accordance with the changing potential. Alternatively, the display of the display element 750($i$, $j$) can be changed. Alternatively, an operation of the display element 750($i$, $j$) can be emphasized. Alternatively, the response of the display element 750($i$, $j$) can be made faster. As a result, a novel display panel that is highly convenient or reliable can be provided.

A transmissive liquid crystal display element can be used as the display element 750($i$, $j$), for example. The display panel 700 has a function of displaying an image by controlling transmission of light emitted by a backlight BL. Alternatively, a reflective liquid crystal display element can be used as the display element 750($i$, $j$), for example. The use of a reflective display element can suppress power consumption of the display panel. Alternatively, a light-emitting element whose luminance can be controlled with the potential VN of the node N1($i$, $j$) can be used as the display element 750(1, j), for example. A light-emitting element which is connected to one of a source electrode and a drain electrode of another transistor whose gate electrode is electrically connected to the node N1($i$, $j$) can be used as the display element 750($i$, $j$), for example. Specifically, a light-emitting diode, an organic EL element, or the like can be used as the display element 750($i$, $j$). Using a light-emitting element as the display element 750($i$, $j$) can increase the luminance immediately after the start of the light emission. Alternatively, display can be performed with a high contrast. Alternatively, radiant impression can be enhanced.

<<Structure Example of Liquid Crystal Element>>

For example, a liquid crystal element that can be driven by a driving method such as an IPS (In-Plane-Switching) mode, a TN (Twisted Nematic) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, or an AFLC (AntiFerroelectric Liquid Crystal) mode can be used.

Furthermore, a liquid crystal element that can be driven by, for example, a vertical alignment (VA) mode, specifically, a driving method such as an MVA (Multi-Domain Vertical Alignment) mode, a PVA (Patterned Vertical Alignment) mode, an ECB (Electrically Controlled Birefringence) mode, a CPA (Continuous Pinwheel Alignment) mode, or an ASV (Advanced Super-View) mode can be used.

<<Structure Example 2 of Display Element 750($i$, $j$)>>

The display element 750($i$, $j$) includes an electrode 751($i$, $j$), an electrode 752, and a layer 753 containing a liquid crystal material (see FIG. 5(A)).

The electrode 751($i$, $j$) is electrically connected to the pixel circuit 530($i$, $j$) at a connection portion 591A.

The electrode 752 is provided such that an electric field that controls the alignment of the liquid crystal material is formed between the electrode 752 and the electrode 751($i$, $j$).

The display element 750($i$, $j$) includes an alignment film AF1 and an alignment film AF2.

<<Layer 753 Containing Liquid Crystal Material>>

The layer 753 containing a liquid crystal material includes a region sandwiched between the alignment film AF1 and the alignment film AF2.

For example, a liquid crystal material having a resistivity of greater than or equal to $1.0 \times 10^{13}$ Ω·cm, preferably greater than or equal to $1.0 \times 10^{14}$ Ω·cm, further preferably greater than or equal to $1.0 \times 10^{15}$ Ω·cm can be used for the layer 753 containing a liquid crystal material. This can suppress a variation in the transmittance of the display element 750($i$, $j$). Furthermore, flickering of the display element 750($i$, $j$) can be suppressed. Furthermore, the rewriting frequency of the display element 750($i$, $j$) can be reduced.

<<Structure Body KB1>>

A structure body KB1 has a function of providing a predetermined space between a functional layer 520 and a substrate 770.

<<Functional Layer 720>>

A functional layer 720 includes a coloring film CF1, an insulating film 771, and a light-blocking film BM.

The coloring film CF1 includes a region sandwiched between the substrate 770 and the display element 750($i$, $j$).

The light-blocking film BM includes an opening portion in a region overlapping with the pixel 702($i$, $j$).

The insulating film 771 includes a region sandwiched between the coloring film CF1 and the layer 753 containing a liquid crystal material or a region sandwiched between the light-blocking film BM and the layer 753 containing a liquid crystal material. Thus, unevenness due to the thickness of the coloring film CF1 can be planarized. Moreover, diffusion of impurities from the light-blocking film BM, the coloring film CF1, or the like into the layer 753 containing a liquid crystal material can be suppressed.

<<Functional Film 770P, Functional Film 770D, and the Like>>

A functional film 770P includes a region overlapping with the display element 750(i, j). Furthermore, the functional film 770D includes a region overlapping with the display element 750(i, j).

An anti-reflection film, a polarizing film, a retardation film, a light diffusion film, a condensing film, or the like can be used as the functional film 770P or the functional film 770D, for example.

Specifically, a circularly polarizing film can be used as the functional film 770P. Furthermore, a light diffusion film can be used as the functional film 770D.

Furthermore, an antistatic film suppressing the attachment of a dust, a water repellent film suppressing the attachment of a stain, an antireflective film (anti-reflection film), a non-glare film (anti-glare film), a hard coat film suppressing generation of a scratch in use, or the like can be used as the functional film 770P.

<Structure Example 2 of Display Panel>

The display panel 700 described in this embodiment includes the driving portion GD (see FIG. 1(A)).

<<Structure Example 1 of Driving Portion GD>>

The driving portion GD supplies the first selection signal and the second selection signal.

For example, the driving portion GD can supply the first selection signal to the scan line G1(i) and supply the second selection signal to the scan line G2(i). In this embodiment, a structure of the first selection signal is described using a change in the potential of the scan line G1(i), and a structure of the second selection signal is described using a change in the potential of the scan line G2(i).

<<Structure Example 1 of First Selection Signal>>

The first selection signal changes from the level LV2 to the level LV1 in a period when the second selection signal is at the level LV4 (see FIG. 1(B)).

For example, the second selection signal is at the level LV4 in a period from Time T11 to Time T15 and a period from Time T21 to Time T25. The first selection signal changes from the level LV2 to the level LV1 at Time T13 and Time T23.

<<Structure Example 1 of Second Selection Signal>>

The second selection signal changes from the level LV4 to the level LV3 twice or more in a period when the first selection signal is at the level LV1.

For example, the first selection signal is at the level LV1 in a period from Time T13 to Time T21. The second selection signal changes from the level LV4 to the level LV3 at Time T15 and Time T18. Furthermore, the first selection signal is at the level LV1 in a period from Time T23 to Time T29. The second selection signal changes from the level LV4 to the level LV3 at Time T25 and Time T28.

Although a case where a potential higher than the potential of the level LV1 is used as the level LV2 and a potential higher than the potential of the level LV3 is used as the level LV4 is described in this embodiment, the combination of the level LV1 to the level LV4 is not limited thereto.

<<Structure Example 2 of Switch SW11>>

The switch SW11 is controlled on the basis of the first selection signal, and the switch SW11 selects a conducting state when the first selection signal is at the level LV2.

The switch SW11 is brought into a non-conducting state when the first selection signal is at the level LV1.

For example, a transistor can be used as the switch SW11. The conduction state of the transistor can be controlled by the control of the potential of a gate electrode of the transistor with the use of the first selection signal.

Specifically, a transistor having n-channel type operation characteristics is used as the switch SW11, and the level LV1 is set at a low potential so that a potential difference $V_{gs}$ between a source electrode and a gate electrode of the transistor can become sufficiently lower than its threshold voltage. Furthermore, the level LV2 is set at a high potential so that the potential difference $V_{gs}$ can become sufficiently higher than the threshold voltage.

<<Structure Example 2 of Switch SW12>>

The switch SW12 is controlled on the basis of the second selection signal, and the switch SW12 selects a conducting state when the second selection signal is at the level LV4.

The switch SW12 is brought into a non-conducting state when the second selection signal is at the level LV3.

For example, a transistor can be used as the switch SW12. The conduction state of the transistor can be controlled by the control of the potential of a gate electrode of the transistor with the use of the second selection signal. Specifically, a transistor having n-channel type operation characteristics is used as the switch SW12, the level LV3 is set lower than a threshold voltage of the transistor, and the level LV4 is set higher than the threshold voltage of the transistor.

Thus, the potential of the node N1(i, j) can be controlled using the switch SW11. Alternatively, a change in the potential of the node N1(1, j) can be promoted or emphasized temporarily using the switch SW12. Alternatively, for example, what is called overdriving is possible in the case where a liquid crystal display element is used as the display element 750(i, j). Alternatively, the operation of the liquid crystal display element can be made faster. As a result, a novel display panel that is highly convenient or reliable can be provided.

<<Structure Example 2 of Pixel Circuit 530(i, j)>>

The pixel circuit 530(i, j) of the display panel 700 described in this embodiment includes a transistor. The transistor includes the semiconductor film 508(1). For example, the transistor can be used as the switch SW11 or the switch SW12 (see FIG. 4(B), FIG. 5(A), and FIG. 5(B)).

<<Structure Example 2 of Driving Portion GD>>

The driving portion GD includes the transistor MG. Furthermore, the transistor MG includes the semiconductor film 508(2) (see FIG. 6(A) and FIG. 6(B)). The semiconductor film 508(2) can be formed through the same process as that for forming the semiconductor film 508(1).

Thus, the driving portion GD can be formed over the substrate over which the pixel circuit 530(i, j) is formed. Alternatively, the number of components of the display panel 700 can be reduced. Alternatively, the manufacturing process of the display panel 700 can be simplified. As a result, a novel display panel that is highly convenient or reliable can be provided.

<<Structure Example 1 of Semiconductor Film 508(1)>>

A semiconductor containing a Group 14 element can be used for the semiconductor film 508(1), for example. Specifically, a semiconductor containing silicon can be used for the semiconductor film 508(1).

[Hydrogenated Amorphous Silicon]

For example, hydrogenated amorphous silicon can be used for the semiconductor film 508(1). Alternatively, microcrystalline silicon or the like can be used for the semiconductor film 508(1). Thus, a display panel having less display unevenness than a display panel that uses polysilicon for the semiconductor film 508(1), for example, can be provided. Alternatively, the size of the display panel can be easily increased.

[Polysilicon]

For example, polysilicon can be used for the semiconductor film 508(1). In this case, for example, the field-effect mobility of the transistor can be higher than that of a transistor that uses hydrogenated amorphous silicon for the semiconductor film 508(1). Alternatively, for example, the driving capability can be higher than that of a transistor that uses hydrogenated amorphous silicon for the semiconductor film 508(1). Alternatively, for example, the aperture ratio of the pixel can be higher than that in the case of a transistor using hydrogenated amorphous silicon for the semiconductor film 508(1).

Alternatively, for example, the reliability of the transistor can be higher than that of a transistor that uses hydrogenated amorphous silicon for the semiconductor film 508(1).

Alternatively, the temperature required for manufacture of the transistor can be lower than that required for a transistor that uses single crystal silicon, for example.

Alternatively, the semiconductor film used for the transistor in the driver circuit can be formed in the same process as the semiconductor film used for the transistor in the pixel circuit. Alternatively, the driver circuit can be formed over the same substrate over which the pixel circuit is formed. Alternatively, the number of components included in an electronic device can be reduced.

[Single Crystal Silicon]

For example, single crystal silicon can be used for the semiconductor film 508(1). In this case, for example, the resolution can be higher than that of a display panel using hydrogenated amorphous silicon for the semiconductor film 508(1). Alternatively, for example, a display panel having less display unevenness than a display panel that uses polysilicon for the semiconductor film 508(1) can be provided. Alternatively, for example, smart glasses or a head mounted display can be provided.

<<Structure Example 2 of Semiconductor Film 508(1)>>

For example, a metal oxide can be used for the semiconductor film 508(1). Thus, a pixel circuit can hold an image signal for a longer time than a pixel circuit utilizing a transistor that uses amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor using amorphous silicon in a semiconductor film can be used, for example. Specifically, a transistor using an oxide semiconductor in a semiconductor film can be used.

A 25-nm-thick film containing indium, gallium, and zinc can be used as the semiconductor film 508(1), for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506 the film containing tantalum and nitrogen is sandwiched.

A stacked-layer film in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region; between the region and the semiconductor film 508(1) the film containing silicon, oxygen, and nitrogen is sandwiched.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508(1).

A manufacturing line for a bottom-gate transistor that uses amorphous silicon as a semiconductor can be easily remodeled into a manufacturing line for a bottom-gate transistor that uses an oxide semiconductor as a semiconductor, for example. Furthermore, for example, a manufacturing line for a top-gate transistor that uses polysilicon as a semiconductor can be easily remodeled into a manufacturing line for a top-gate transistor that uses an oxide semiconductor as a semiconductor. In either remodeling, an existing manufacturing line can be effectively utilized.

This can suppress flickering. Alternatively, the power consumption can be reduced. Alternatively, a moving image with quick movements can be smoothly displayed. Alternatively, a photograph and the like can be displayed with a wide range of grayscale. As a result, a novel display panel that is highly convenient or reliable can be provided.

<<Structure Example 3 of Semiconductor Film 508(1)>>

For example, a compound semiconductor can be used as the semiconductor of the transistor. Specifically, a semiconductor containing gallium arsenide can be used.

For example, an organic semiconductor can be used as the semiconductor of the transistor. Specifically, an organic semiconductor containing polyacene or graphene can be used for a semiconductor film.

<Structure Example 3 of Display Panel>

The display panel 700 described in this embodiment includes the driving portion SD (see FIG. 1(A)).

<<Structure Example 1 of Driving Portion SD>>

The driving portion SD supplies the first signal and the second signal.

For example, the driving portion SD can supply the first signal to the signal line S1(j) and supply the second signal to the signal line S2(j). In this embodiment, a structure of the first signal is described using a change in the potential of the signal line S1(j), and a structure of the second signal is described using a change in the potential of the signal line S2(j).

<<Structure Example 1 of First Signal>>

For example, a signal generated on the basis of image data can be used as the first signal. Specifically, a signal having its amplitude center at a potential VCOM can be used as the first signal (see FIG. 1(B)).

For example, a signal which alternates between a period when a potential higher than or equal to the potential VCOM is used and a period when a potential lower than or equal to the potential VCOM is used can be used as the first signal. Specifically, a signal whose polarity with respect to the potential VCOM is inverted in synchronization with the first selection signal can be used as the first signal.

For example, data displayed on the pixel 702($i, j$) is supplied using the potential higher than or equal to the potential VCOM in a period from Time T11 to Time T13, and data displayed on a pixel 702($i$+1, j) is supplied using the potential lower than or equal to the potential VCOM in a period from Time T13 to Time T15.

Thus, data can be supplied in such a way that the polarity is inverted on the row basis.

<<Structure Example 1 of Second Signal>>

The second signal includes the level LV5 and the level LV6 (see FIG. 1(B)).

The second signal changes from the level LV5 to the level LV6 or from the level LV6 to the level LV5 when the first selection signal is at the level LV1 and the second selection signal is at the level LV4.

For example, at Time T14 when the first selection signal is at the level LV1 and the second selection signal is at the level LV4, the second signal changes from the level LV5 to the level LV6. Furthermore, at Time T17, the second signal changes from the level LV6 to the level LV5.

Furthermore, for example, at Time T24 when the first selection signal is at the level LV1 and the second selection signal is at the level LV4, the second signal changes from the level LV6 to the level LV5. Moreover, at Time T27, the second signal changes from the level LV5 to the level LV6.

For example, a signal which alternately becomes the level LV6 and the level LV5 in synchronization with the period when the potential higher than or equal to the potential VCOM is used as the first signal and the period when the potential lower than or equal to the potential VCOM is used as the first signal can be used as the second signal.

<<Potential VN of Node N1(i, j)>>

The potential VN of the node N1(1, j) changes on the basis of a potential difference AV between the level LV5 and the level LV6 and the first signal.

For example, the potential VN of the node N1(i, j) changes on the basis of the first signal in a period from Time T11 to Time T13. Furthermore, in a period from Time T14 to Time T17, it changes on the basis of the potential difference AV and the first signal. In addition, in a period from Time T17 to Time T19, it changes on the basis of the first signal.

Furthermore, for example, the potential VN of the node N1(i, j) changes on the basis of the first signal in a period from Time T21 to Time T23. Furthermore, the potential VN changes on the basis of the potential difference AV and the first signal in a period from Time T24 to Time T27. Moreover, the potential VN changes on the basis of the first signal in a period from Time T27 to Time T29.

Thus, the potential of the node N1(i, j) can be controlled using the first signal and the second signal. Alternatively, the potential of the node N1(i, j) can be determined using the first signal and can be changed using the second signal. Alternatively, the potential of the node N1(1, j) can be determined using the first signal and can be temporarily changed using the second signal. Alternatively, a change in the potential of the node N1(i, j) can be emphasized using the second signal. Alternatively, the first signal and the first signal to which the potential difference between the first level LV5 and the second level LV6 is added can be supplied to the display element. As a result, a novel display panel that is highly convenient or reliable can be provided.

Furthermore, the potential VN changes on the basis of the potential difference AV and the following formula. Note that $V_{DATA}$ in the formula is the potential of the first signal, Cu is the capacitance of the capacitor C11, and C12 is the capacitance of the capacitor C12.

[Formula 1]

$$VN = V_{DATA} + \left(\frac{C_{12}}{C_{11} + C_{12}}\right) \times \Delta V \quad (1)$$

<<Structure Example 2 of Second Signal>>

The second signal changes from the level LV5 to the level LV6 or from the level LV6 to the level LV5 when the first selection signal is at the level LV1 and the second selection signal is at the level LV4 (see FIG. 2).

For example, at Time T34 when the first selection signal is at the level LV1 and the second selection signal is at the level LV4, the second signal changes from the level LV5 to the level LV6.

Moreover, for example, at Time T24 when the first selection signal is at the level LV1 and the second selection signal is at the level LV4, the second signal changes from the level LV6 to the level LV5.

For example, a signal which alternately becomes the level LV6 and the level LV5 in synchronization with the period when the potential higher than or equal to the potential VCOM is used as the first signal and the period when the potential lower than or equal to the potential VCOM is used as the first signal can be used as the second signal.

<<Potential VN of Node N1(i, j)>>

The potential VN of the node N1(i, j) changes on the basis of the potential difference AV between the level LV5 and the level LV6 and the first signal.

For example, the potential VN of the node N1(i, j) changes on the basis of the first signal in a period from Time T31 to Time T33. Furthermore, in a period from Time T34 to Time T41, it changes on the basis of the potential difference AV and the first signal.

Furthermore, for example, the potential VN of the node N1(i, j) changes on the basis of the first signal in a period from Time T41 to Time T42. Furthermore, the potential VN changes on the basis of the potential difference AV and the first signal in one frame period after Time T44.

Thus, the potential of the node N1(i, j) can be controlled using the first signal and the second signal. Alternatively, the potential of the node N1(i, j) can be adjusted using the first signal, and a basic potential can be added thereto using the second signal. Alternatively, a potential at which the transmittance of a liquid crystal element starts to change can be used as the second potential. As a result, a novel display panel that is highly convenient or reliable can be provided.

<Structure Example 2 of Driving Portion SD>

The driving portion SD of the display panel 700 described in this embodiment includes the driver circuit DC21 and the driver circuit DC22 (see FIG. 1(A)).

<<Structure Example 1 of Driver Circuit DC21>>

The driver circuit DC21 generates the first signal.

<<Structure Example 1 of driver circuit DC22>>

The driver circuit DC22 generates the second signal.

For example, a circuit which supplies the level LV5 or the level LV6 on the basis of the control signal SP can be used as the driver circuit DC22 (see FIG. 8(A) and FIG. 8(B)).

Thus, a conventional driver circuit can be used as the first driver circuit DC21. Alternatively, the performance of the display panel 700 can be improved using the second driver circuit DC22 while the existing resources are utilized. Alternatively, it is possible to concentrate on the development of the second driver circuit DC22. Alternatively, the development period can be shortened. Alternatively, the cost of development can be saved. As a result, a novel display panel that is highly convenient or reliable can be provided.

For example, the driver circuit DC22 can supply the level LV6 to a signal line S2(j+1) when supplying the level LV5 to the signal line S2(j) (see FIG. 8(A) or FIG. 8(B)). Furthermore, the driver circuit DC22 can supply the level LV5 to the signal line S2(j+1) when supplying the level LV6 to the signal line S2(j). In this manner, signals whose polarities are inverted alternately can be supplied to a plurality of pixels provided in the row direction (the direction indicated by an arrow R1 in the drawing).

Furthermore, for example, the driver circuit DC22 can supply the level LV5 to the signal line S2(j+1) when supplying the level LV5 to the signal line S2(j) (see FIG. 8(C)). In addition, the driver circuit DC22 can supply the level LV5 to the signal line S2(j+1) when supplying the level LV5 to the signal line S2(j). In this manner, signals having the same polarity can be supplied to a plurality of pixels provided in the row direction.

<Structure Example 2 of Driver Circuit DC22>

Figure 7C:
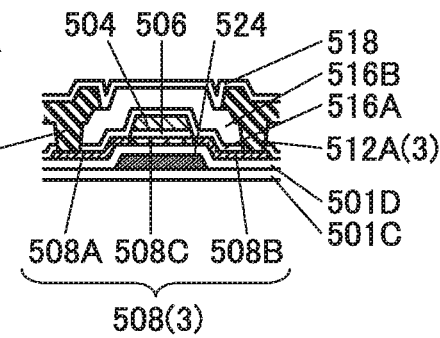

Moreover, the driver circuit DC22 of the display panel 700 described in this embodiment includes the transistor MS (see FIG. 7(A) and FIG. 7(C)). Furthermore, the transistor MS includes the semiconductor film 508(3).

The semiconductor film 508(3) can be formed through the same process as that for forming the semiconductor film 508(1).

Thus, the driver circuit DC22 can be formed over the substrate over which the pixel circuit 530(i, j) is formed. Alternatively, the number of components of the display panel 700 can be reduced. Alternatively, the manufacturing process of the display panel 700 can be simplified. As a result, a novel display panel that is highly convenient or reliable can be provided.

<Structure Example 4 of Display Panel>

Moreover, the display panel 700 described in this embodiment includes the display region 231 (see FIG. 1(A)).

<<Structure Example 1 of Display Region 231>>

The display region 231 includes the one group of pixels 702(i, 1) to 702(i, n), the different group of pixels 702(1, j) to 702(m, j), the scan line G1(i), the scan line G2(i), the signal line S1(j), and the signal line S2(j).

<<Structure Example 1 of One Group of Pixels 702(i, 1) to 702(i, n)>>

The one group of pixels 702(i, 1) to 702(i, n) include the pixel 702(i, j). Furthermore, the one group of pixels 702(i, 1) to 702(i, n) are provided in the row direction (the direction indicated by the arrow R1 in the drawing).

<<Structure Example 1 of Different Group of Pixels 702(1, j) to 702(m, j)>>

The different group of pixels 702(1, j) to 702(m, j) include the pixel 702(i, j). Furthermore, the different group of pixels 702(1, j) to 702(m, j) are provided in the column direction that intersects the row direction (the direction indicated by an arrow C1 in the drawing).

<<Structure Example 1 of Scan Line G1(i)>>

The scan line G1(i) is electrically connected to the one group of pixels 702(i, 1) to 702(i, n).

<<Structure Example 1 of Scan Line G2(i)>>

The scan line G2(i) is electrically connected to the one group of pixels 702(i, 1) to 702(i, n).

<<Structure Example 1 of Signal Line S1(j)>>

The signal line S1(j) is electrically connected to the different group of pixels 702(1, j) to 702(m, j).

<<Structure Example 1 of Signal Line S2(j)>>

The signal line S2(j) is electrically connected to the different group of pixels 702(1, j) to 702(m, j).

Thus, image data can be supplied to a plurality of pixels. Alternatively, the second selection signal can be supplied on the row basis, independently of the first selection signal. Alternatively, the second signal can be supplied on the column basis, independently of the first signal. As a result, a novel display panel that is highly convenient or reliable can be provided.

<<Structure Example 2 of Display Region 231>>

The display region 231 includes 7600 or more pixels in the row direction and 4300 or more pixels in the column direction. For example, 7680 pixels are provided in the row direction and 4320 pixels are provided in the column direction. Thus, what is called a 8K television can be provided. Alternatively, the display region 231 includes 3800 or more pixels in the row direction and 900 or more pixels in the column direction. For example, 3840 pixels are provided in the row direction and 1000 pixels are provided in the column direction. Thus, what is called a 4K television can be provided.

Thus, for example, overdriving of pixels of a display panel which has a larger number of pixels than a high-definition television such as a 4K television or a 8K television is possible. Alternatively, overdriving of pixels of a display panel which has a shorter data writing time than a high-definition television is possible.

<Structure Example 5 of Display Panel>

The display region 231 includes the pixel 702(i, j), a pixel 702(i, j+1), and a pixel 702(i, j+2) (see FIG. 3(C)).

The pixel 702(i, j) displays a color that has a chromaticity x of greater than 0.680 and less than or equal to 0.720 and a chromaticity y of greater than or equal to 0.260 and less than or equal to 0.320 in the CIE 1931 chromaticity coordinates.

The pixel 702(i, j+1) displays a color that has a chromaticity x of greater than or equal to 0.130 and less than or equal to 0.250 and a chromaticity y of greater than 0.710 and less than or equal to 0.810 in the CIE 1931 chromaticity coordinates.

The pixel 702(i, j+2) displays a color that has a chromaticity x of greater than or equal to 0.120 and less than or equal to 0.170 and a chromaticity y of greater than or equal to 0.020 and less than 0.060 in the CIE 1931 chromaticity coordinates.

The pixel 702(i, j), the pixel 702(i, j+1), and the pixel 702(i, j+2) are provided so that the area ratio of their color gamut to the BT.2020 color gamut in the CIE chromaticity diagram (x,y) is higher than or equal to 80%, or alternatively, the color gamut coverage is higher than or equal to 75%. Preferably, they are provided so that the area ratio is higher than or equal to 90%, or alternatively, the coverage is higher than or equal to 85%.

<Structure Example 6 of Display Panel>

The display region 231 of the display panel 700 described in this embodiment is provided between the driver circuit DC21 and the driver circuit DC22 (see FIG. 1(A)).

<<Structure Example 1 of Signal Line S1(j)>>

The signal line S1(j) is electrically connected to the driver circuit DC21.

<<Structure Example 1 of Signal Line S2(j)>>

The signal line S2(j) is electrically connected to the driver circuit DC22.

Thus, the display region 231 can be closer to the first driver circuit DC21. Alternatively, the display region 231 can be closer to the first driver circuit DC22. Alternatively, degradation of the first signal can be prevented. Alternatively, degradation of the second signal can be prevented. As a result, a novel display panel that is highly convenient or reliable can be provided.

<Structure Example 7 of Display Panel>

The second driving portion SD of the display panel 700 described in this embodiment includes the third driver circuit DC23 (see FIG. 1(A)).

<<Structure Example 1 of Driver Circuit DC23>>

The driver circuit DC23 generates the second signal.

<<Structure Example 3 of Display Region 231>>

The display region 231 is provided between the driver circuit DC22 and the driver circuit DC23.

<<Structure Example 2 of Signal Line S2(j)>>

The signal line S2(j) is electrically connected to the driver circuit DC22 and the driver circuit DC23.

Thus, the load derived from the different group of pixels 702(1, j) to 702(m, j) and the signal line S2(j) can be divided between the second driver circuit DC22 and the third driver circuit DC23. Alternatively, the different group of pixels 702(1, j) to 702(m, j) and the signal line S2(j) can be driven using the second driver circuit DC22 and the third driver circuit DC23. Alternatively, the time taken for the potentials of the different group of pixels 702(1, j) to 702(m, j) and the potential of the signal line S2(j) to reach a predetermined value can be shortened. Alternatively, an operation can be performed at high speed. As a result, a novel display panel that is highly convenient or reliable can be provided.

Note that this embodiment can be combined with other embodiments in this specification as appropriate.

Embodiment 2

Described in this embodiment is a metal oxide that can be used for a semiconductor film of a transistor disclosed in one embodiment of the present invention. Note that in the case where a metal oxide is used for a semiconductor film of a transistor, the metal oxide may be rephrased as an oxide semiconductor.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

An example of the non-single-crystal oxide semiconductor is an oxide semiconductor called a semi-crystalline oxide semiconductor. The semi-crystalline oxide semiconductor has an intermediate structure between the single crystal oxide semiconductor and the amorphous oxide semiconductor. The structure of the semi-crystalline oxide semiconductor is more stable than that of the amorphous oxide semiconductor. An example of the semi-crystalline oxide semiconductor is an oxide semiconductor having a CAAC structure and a CAC (Cloud-Aligned Composite) composition. The details of the CAC will be described below.

A CAC-OS (Cloud-Aligned Composite oxide semiconductor) may be used for a semiconductor film of a transistor disclosed in one embodiment of the present invention.

The aforementioned non-single-crystal oxide semiconductor or CAC-OS can be suitably used for a semiconductor film of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor film of a transistor. The use of the CAC-OS allows the transistor to have high electrical characteristics or high reliability.

The CAC-OS will be described in detail below.

A CAC-OS or a CAC-metal oxide has a conducting function in a part of the material and has an insulating function in a part of the material and has a function of a semiconductor as a whole. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current drive capability, that is, a high on-state current and high field-effect mobility.

In other words, the CAC-OS or the CAC-metal oxide can also be called a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. It is particularly preferable that the metal oxide contain indium and zinc. In addition to them, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a film formation gas. Furthermore, the ratio of the flow rate of an oxygen gas to the total flow rate of the film formation gas at the time of film formation is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (μ) can be achieved.

Moreover, a semiconductor element using the CAC-OS has high reliability. Thus, the CAC-OS is most suitable for a variety of semiconductor devices such as display panels.

This embodiment can be combined with other embodiments as appropriate.

Embodiment 3

In this embodiment, a structure of a display device of one embodiment of the present invention will be described with reference to FIG. 9.

FIG. 9 is a view showing the structure of the display device of one embodiment of the present invention. FIG. 9(A) is a block diagram of the display device of one embodiment of the present invention. FIG. 9(B-1) to FIG. 9(B-3) are projection views explaining the appearance of the display device of one embodiment of the present invention.
<Structure Example of Display Device>

Figure 9A:
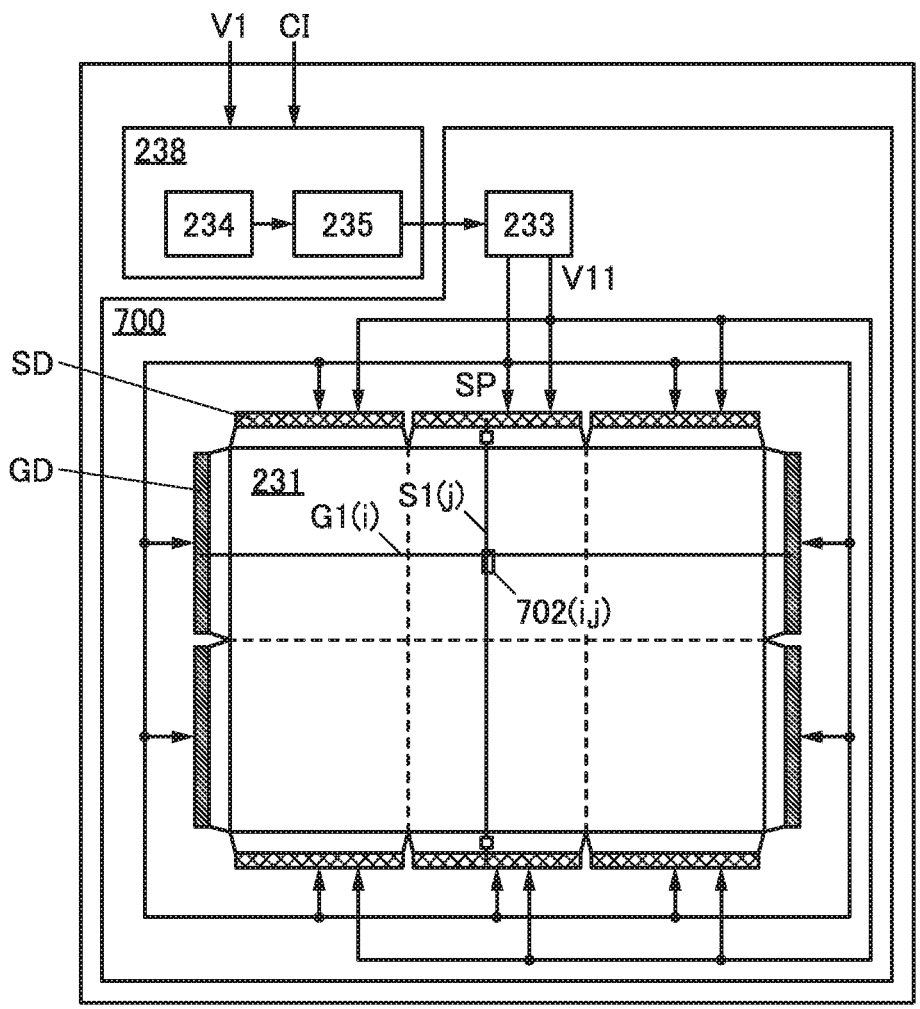
Figure 9A:
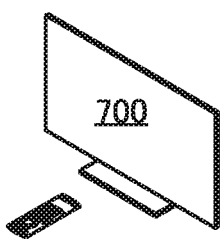
Figure 9A:
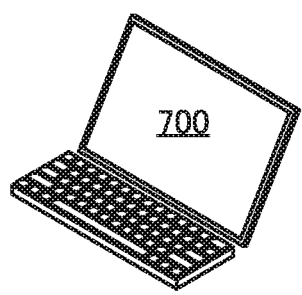
Figure 9A:
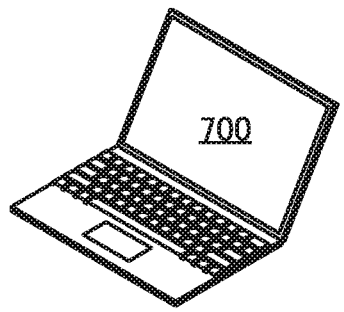

The display device described in this embodiment includes the control portion 238 and the display panel 700 (see FIG. 9(A)).
<<Structure Example of Control Portion 238>>

The control portion 238 is supplied with the image data V1 and the control data CI. For example, a clock signal, a timing signal, or the like can be used as the control data CI.

The control portion 238 generates the data V11 on the basis of the image data V1 and generates the control signal SP on the basis of the control data CI. The control portion 238 supplies the data V11 and the control signal SP. The data V11 includes a grayscale of 8 bits or more, preferably 12 bits or more, for example. For example, a clock signal, a start pulse, or the like of a shift register used for a driver circuit can be used as the control signal SP.

Specifically, the control portion 238 includes a control circuit 233, a decompression circuit 234, and an image processing circuit 235.
<<Control Circuit 233>>

The control circuit 233 has a function of generating and supplying the control signal SP.

The control circuit 233 has a function of supplying the control signal SP. For example, a clock signal, a timing signal, or the like can be used as the control signal SP.

A timing controller can be used as the control circuit 233, for example.
<<Decompression Circuit 234>>

The decompression circuit 234 has a function of decompressing the image data V1 supplied in a compressed state. The decompression circuit 234 includes a memory portion. The memory portion has a function of storing decompressed image data, for example.
<<Image Processing Circuit 235>>

The image processing circuit 235 includes a memory region, for example. The memory region has a function of storing data included in the image data V1, for example.

The image processing circuit 235 has a function of generating the data V11 by correcting the image data V1 on the basis of a predetermined characteristic curve and a function of supplying the data V11, for example.
<<Structure Example of Display Panel>>

The display panel 700 is supplied with the data V11 and the control signal SP. The driver circuit operates on the basis of the control signal SP, and the pixel 702(i, j) performs display on the basis of the data V11.

For example, the display panel described in Embodiment 1 can be used.

For example, the driving portion SD is supplied with the control signal SP and the data V11 and supplies the first signal and the second signal. In addition, the driving portion GD is supplied with the control signal SP and supplies the first selection signal and the second selection signal.

Using the control signal SP enables a synchronized operation of the driving portion SD and the driving portion GD.

Note that the control circuit 233 can be included in the display panel. For example, the control circuit 233 mounted on a rigid substrate can be used for the display panel. Specifically, the control circuit 233 mounted on the rigid substrate can be electrically connected to the driver circuit with the use of a flexible printed circuit.

Thus, the image data can be displayed using the display element. As a result, a novel display device that is highly convenient or reliable can be provided. Alternatively, for example, a television receiver system (see FIG. 9(B-1)), a video monitor (see FIG. 9(B-2)), a laptop computer (see FIG. 9(B-3)), or the like can be provided.

Note that this embodiment can be combined with other embodiments in this specification as appropriate.

Embodiment 4

In this embodiment, a structure of an input/output device of one embodiment of the present invention will be described with reference to FIG. 10.

Figure 10:
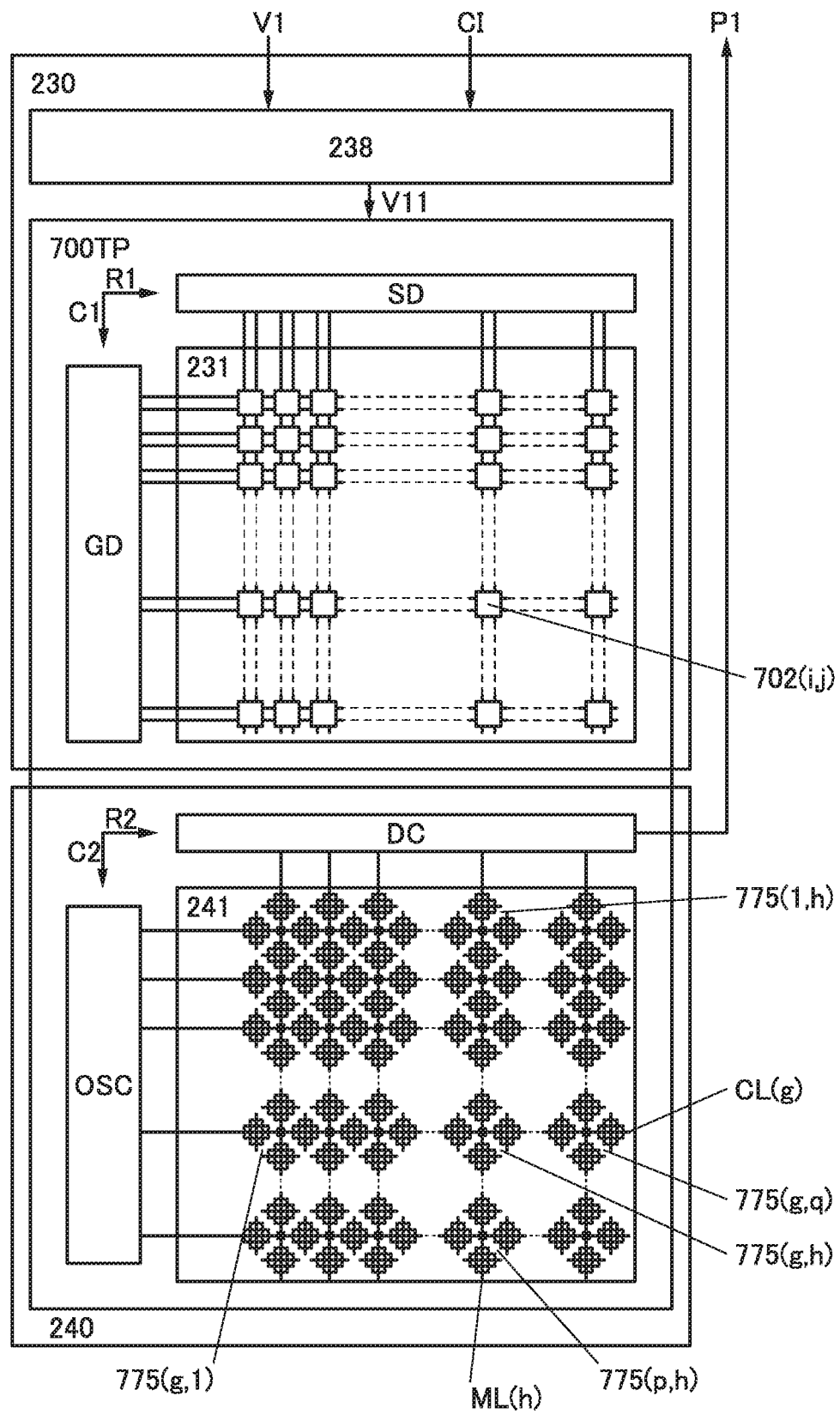
FIG. 10 A view showing an input/output device of an embodiment.

FIG. 10 is a block diagram showing the structure of the input/output device of one embodiment of the present invention.
<Structure Example of Input/Output Device>

The input/output device described in this embodiment includes the input portion 240 and the display portion 230 (see FIG. 10).
<<Display Portion 230>>

For example, the display panel 700 described in Embodiment 1 can be used for the display portion 230. Note that a structure including the input portion 240 and the display portion 230 can be referred to as an input/output panel 700TP.
<<Structure Example 1 of Input Portion 240>>

The input portion 240 includes the sensing region 241. The input portion 240 has a function of sensing an object approaching the sensing region 241.

The sensing region 241 includes a region overlapping with the pixel 702(i, j).

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.
<<Structure Example 2 of Input Portion 240>>

The input portion 240 can include an oscillation circuit OSC and a sensing circuit DC (see FIG. 10).
<<Sensing Region 241>>

The sensing region 241 includes one or more sensing elements, for example.

The sensing region 241 includes a group of sensing elements 775(g, 1) to 775(g, q) and a different group of sensing elements 775(1, h) to 775(p, h). Note that g is an integer greater than or equal to 1 and less than or equal to p, h is an integer greater than or equal to 1 and less than or equal to q, and p and q are each an integer greater than or equal to 1.

The group of sensing elements 775(g, 1) to 775(g, q) include a sensing element 775(g, h) and are provided in the row direction (the direction indicated by an arrow R2 in the drawing). Note that the direction indicated by the arrow R2 may be the same as or different from the direction indicated by the arrow R1.

The different group of sensing elements 775(1, h) to 775(p, h) include the sensing element 775(g, h) and are provided in the column direction (the direction indicated by an arrow C2 in the drawing) that intersects the row direction.
<<Sensing Element>>

The sensing element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with other embodiments in this specification as appropriate.

Embodiment 5

In this embodiment, a structure of a data processing device of one embodiment of the present invention will be described with reference to FIG. 11 to FIG. 13.

Figure 11A:
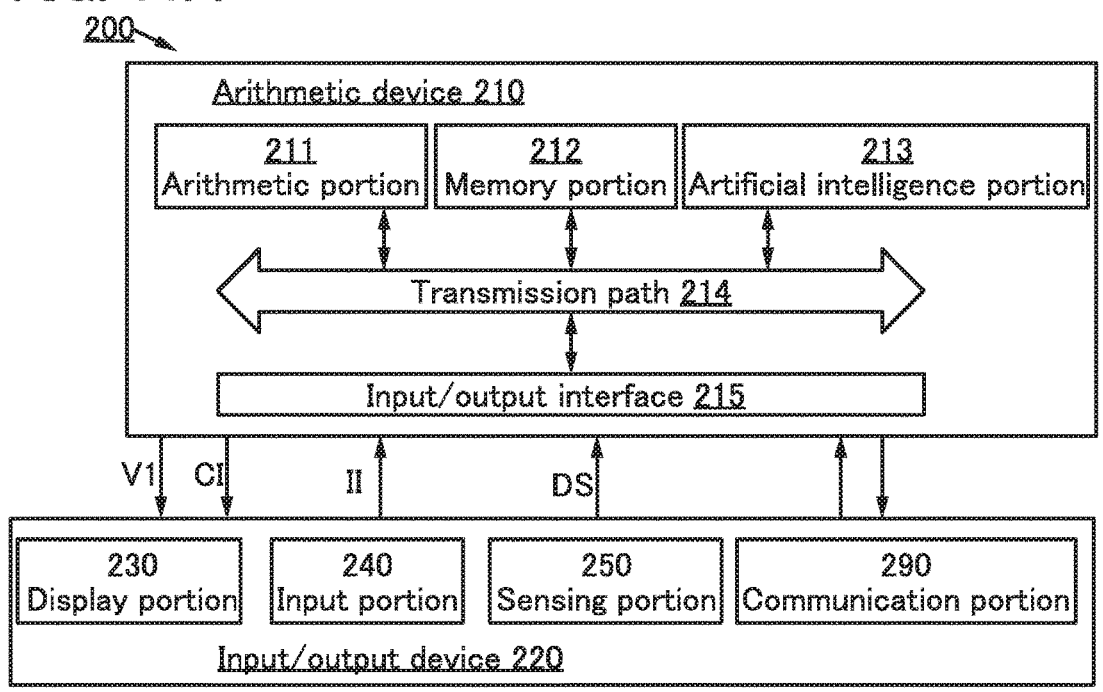
FIGS. 11A-11C Views showing a data processing device of an embodiment.
Figure 11B:
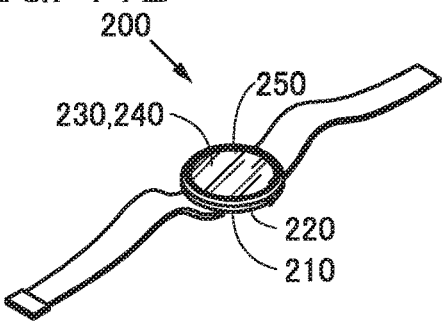
Figure 11C:
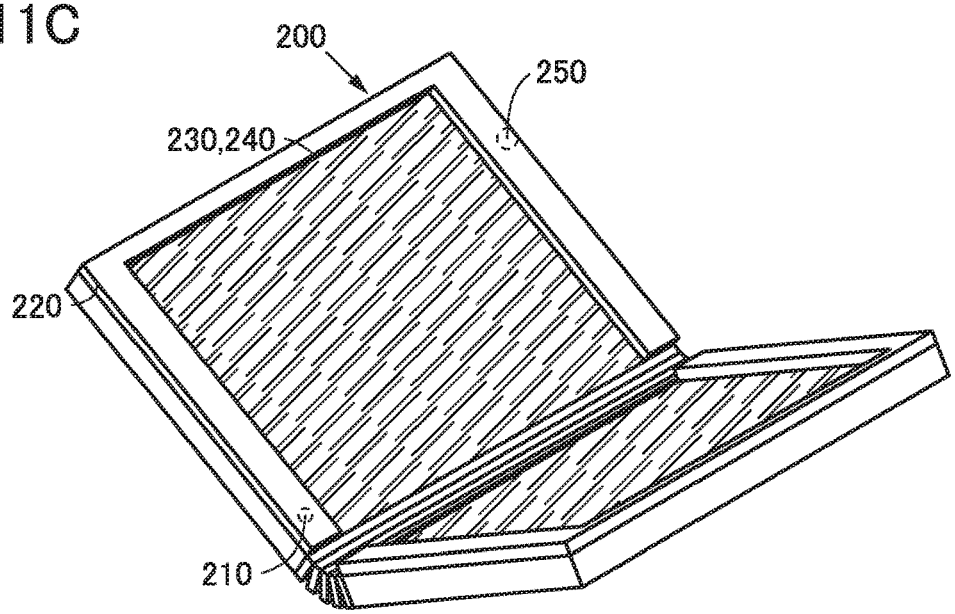

FIG. 11(A) is a block diagram showing the structure of the data processing device of one embodiment of the present invention. FIG. 11(B) and FIG. 11(C) are projection views showing examples of the appearance of the data processing device.

Figure 12A:
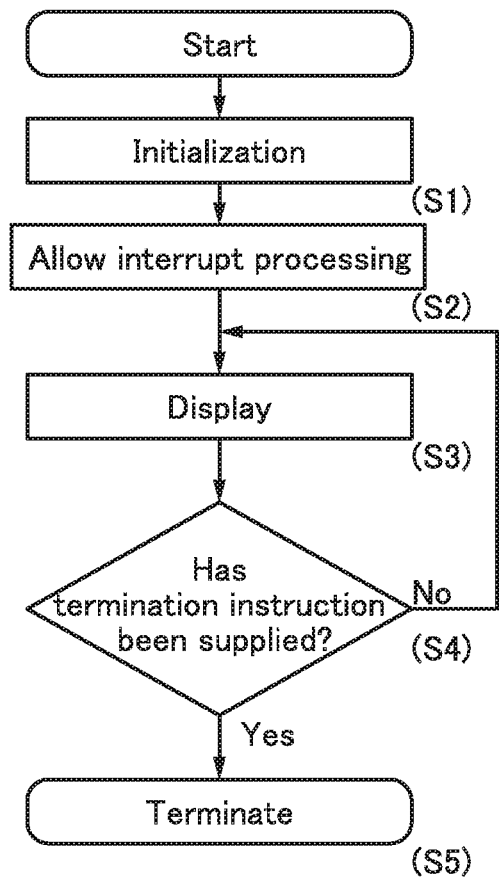
FIGS. 12A-12B Views showing a data processing device of an embodiment.
Figure 12B:
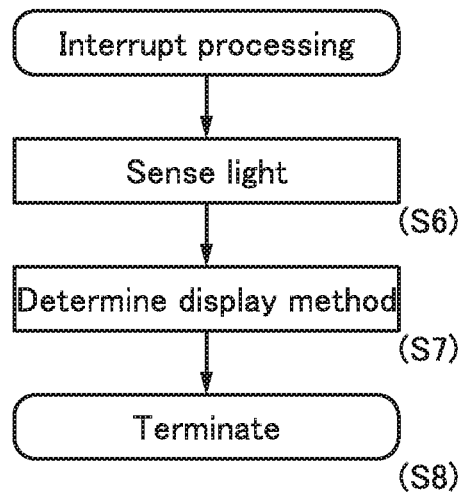

FIG. 12 is a flow chart showing a program of one embodiment of the present invention. FIG. 12(A) is a flow chart showing main processing of the program of one embodiment of the present invention, and FIG. 12(B) is a flow chart showing interrupt processing.

Figure 13A:
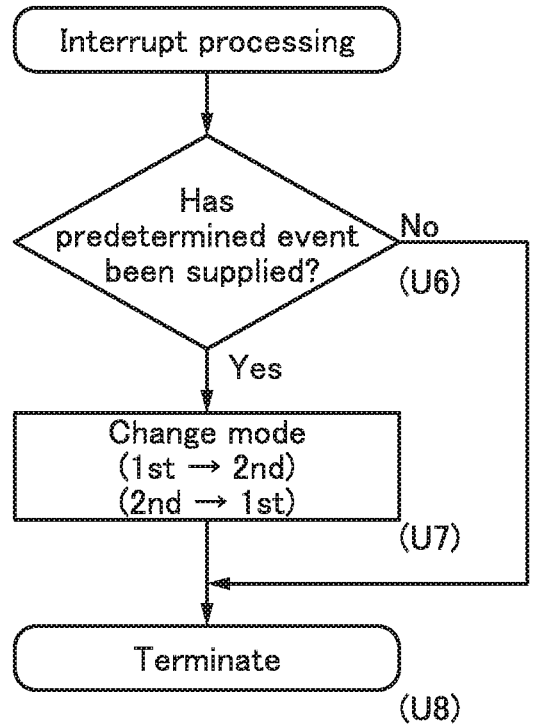
FIGS. 13A-13C Views showing a data processing device of an embodiment.
Figure 13B:
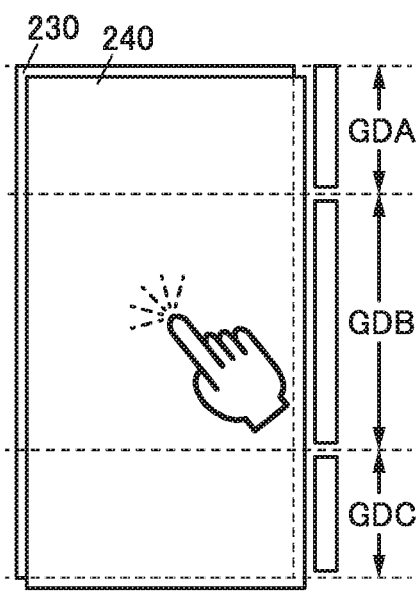
Figure 13C:
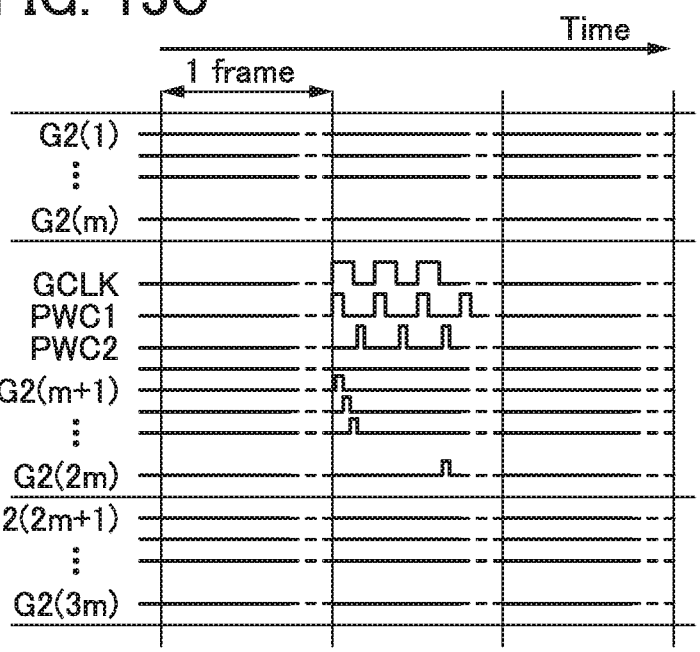

FIG. 13 shows the program of one embodiment of the present invention. FIG. 13(A) is a flow chart showing interrupt processing of the program of one embodiment of the present invention. FIG. 13(B) is a schematic view showing operation of the data processing device, and FIG. 13(C) is a timing chart showing operation of the data processing device of one embodiment of the present invention.

<Structure Example 1 of Data Processing Device>

A data processing device described in this embodiment includes an arithmetic device 210 and an input/output device 220 (see FIG. 11(A)). Note that the input/output device is electrically connected to the arithmetic device 210. A data processing device 200 can also include a housing (see FIG. 11(B) or FIG. 11(C)).

<<Structure Example 1 of Arithmetic Device 210>>

The arithmetic device 210 is supplied with the input data II or the sensing data DS. The arithmetic device 210 supplies the control data CI and the image data V1.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

<<Structure Example of Input/Output Device 220>>

The input/output device 220 supplies the input data II and the sensing data DS. The input/output device 220 is supplied with the control data CI and the image data V1 (see FIG. 11(A)).

As the input data II, for example, a scan code of a keyboard, positional data, operation data of buttons, sound data, image data, or the like can be used. Alternatively, for example, illuminance data, attitude data, acceleration data, bearing data, pressure data, temperature data, humidity data, or the like of an environment where the data processing device 200 is used, or the like can be used as the sensing data DS.

As the control data CI, for example, a signal controlling the luminance of display of the image data V1, a signal controlling the chroma of display of the image data V1, or a signal controlling the hue of display of the image data V1 can be used. Alternatively, a signal that changes display of part of the image data V1 can be used as the control data CI.

The input/output device 220 includes the display portion 230, the input portion 240, and a sensing portion 250. For example, the input/output device described in Embodiment 4 can be used.

The display portion 230 displays the image data V1 on the basis of the control data CI.

The input portion 240 generates the input data II.

The sensing portion 250 generates the sensing data DS.

<<Display Portion 230>>

The display portion 230 has a function of displaying an image on the basis of the image data V1. The display portion 230 has a function of displaying an image on the basis of the control data CI.

The display portion 230 includes the control portion 238, a driver circuit GD, a driver circuit SD, and the display panel 700 (see FIG. 9). For example, the display device described in Embodiment 3 can be used for the display portion 230.

<<Input Portion 240>>

The input portion 240 has a function of supplying positional data P1. A variety of human interfaces or the like can be used for the input portion 240 (see FIG. 11(A)).

For example, a keyboard, a mouse, a touch sensor, a microphone, a camera, or the like can be used as the input portion 240. Note that a touch sensor including a region overlapping with the display portion 230 can be used. An input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of the finger in contact with the touch panel and can determine that a predetermined gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

<<Sensing Portion 250>>

The sensing portion 250 has a function of supplying the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photosensor, an attitude sensor, an acceleration sensor, a direction sensor, a GPS (Global positioning System) signal receiving circuit, a pressure sensor, a temperature sensor, a humidity sensor, a camera, or the like can be used as the sensing portion 250.

<<Communication Portion 290>>

A communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the data processing device can determine the intensity of light received by the housing of the data processing device and operate under the usage environment of the data processing device. Alternatively, a user of the data processing device can select a display method. As a result, a novel data processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

<<Structure Example 2 of Arithmetic Device 210>>

The arithmetic device 210 includes an artificial intelligence portion 213 (see FIG. 11(A)). The artificial intelligence portion 213 generates the control data CI on the basis of the input data II or the sensing data DS.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate the control data CI for display of extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference Using Sensing Data DS]

Specifically, the artificial intelligence portion 213 can generate an inference RI with the use of the sensing data DS as data IN. Alternatively, the artificial intelligence portion 213 can generate the control data CI on the basis of the inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion 248 included in the input portion 240 can be used as the control data CI.

<Structure Example 3 of Data Processing Device>

Another structure of the data processing device of one embodiment of the present invention is described with reference to FIG. 12(A) and FIG. 12(B).

<<Program>>

The program of one embodiment of the present invention has the following steps (see FIG. 12(A)).

[First Step]

In a first step, setting is initialized (see (S1) in FIG. 12(A)).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see (S2) in FIG. 12(A)). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image data is displayed by a predetermined mode or a predetermined display method selected in the first step or the interrupt processing (see (S3) in FIG. 12(A)). Note that the predetermined mode determines a mode of displaying the data, and the predetermined display method determines a method for displaying the image data. For example, the image data V1 can be used as data to be displayed.

One method for displaying the image data V1 can be associated with the first mode, for example. Alternatively, another method for displaying the image data V1 can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be configured to emit light in a pulsed manner so that image data is displayed. Specifically, an organic EL element can be configured to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied (Yes), whereas the program proceeds to the third step when the termination instruction has not been supplied (No) (see (S4) in FIG. 12(A)).

For example, the termination instruction supplied in the interrupt processing may be used for the determination.

[Fifth Step]

In the fifth step, the program terminates (see (S5) in FIG. 12(A)).

<<Interrupt Processing>>

The interrupt processing includes a sixth step to an eighth step described below (see FIG. 12(B)).

[Sixth Step]

In the sixth step, the illuminance of the environment where the data processing device 200 is used is sensed using the sensing portion 250, for example (see (S6) in FIG. 12(B)). Note that color temperature or chromaticity of ambient light may be sensed instead of the illuminance of the environment.

[Seventh Step]

In the seventh step, a display method is determined on the basis of the sensed illuminance data (see (S7) in FIG. 12(B)). For example, a display method is determined such that the brightness of display is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see (S8) in FIG. 12(B)).

<Structure Example 3 of Data Processing Device>

Another structure of the data processing device of one embodiment of the present invention is described with reference to FIG. 13.

FIG. 13(A) is a flow chart showing a program of one embodiment of the present invention. FIG. 13(A) is a flow chart showing interrupt processing different from the interrupt processing shown in FIG. 12(B).

Note that the structure example 3 of the data processing device is different from the interrupt processing described with reference to FIG. 12(B) in that the interrupt processing includes a step of changing a mode on the basis of a supplied predetermined event. Different portions will be described in detail here, and refer to the above description for portions that can use similar structures.

<<Interrupt Processing>>

The interrupt processing includes a sixth step to an eighth step described below (see FIG. 13(A)).

[Sixth Step]

In the sixth step, the program proceeds to the seventh step when a predetermined event has been supplied (Yes), whereas the program proceeds to the eighth step when the predetermined event has not been supplied (No) (see (U6) in FIG. 13(A)). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 13(A)). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 13(B)).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 13(B) and FIG. 13(C)). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G2($m$+1) to a scan line G2(2$m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 13(A)). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is provided so as to be pushed in a housing can be used for the sensing portion 250.

<<Instruction Associated with Predetermined Event>>

For example, the termination instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 11(C)). Alternatively, materials distributed in a conference room in, for example, a company can be received and used for a conference material.

Note that this embodiment can be combined with other embodiments in this specification as appropriate.

Embodiment 6

In this embodiment, structures of a data processing device of one embodiment of the present invention are described with reference to FIG. 14 and FIG. 15. In this embodiment, structures of a data processing device of one embodiment of the present invention are described with reference to FIG. 14 and FIG. 15.

FIG. 14 and FIG. 15 are views showing structures of the data processing device of one embodiment of the present invention. FIG. 14(A) is a block diagram of the data processing device, and FIGS. 14(B) to 14(E) are perspective views showing structures of the data processing device. FIGS. 15A to 15E are perspective views showing structures of the data processing device.

<Data Processing Device>

Figure 14A:
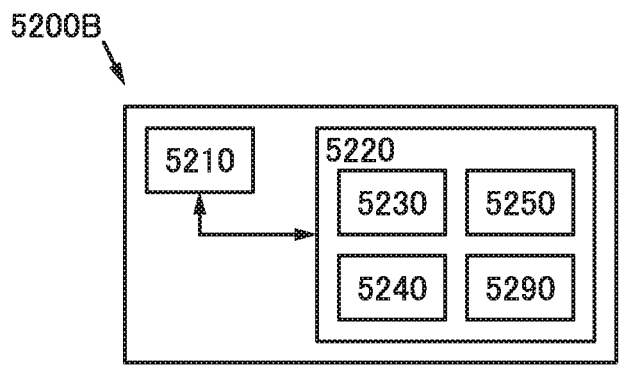
FIGS. 14A-14E Views showing a data processing device of an embodiment.

A data processing device 5200B described in this embodiment includes an arithmetic device 5210 and an input/output device 5220 (see FIG. 14(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input portion 5240.

The display portion 5230 includes a display panel and has a function of displaying image data. For example, the display panel described in Embodiment 1 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, or near field communication, for example.

Figure 14B:
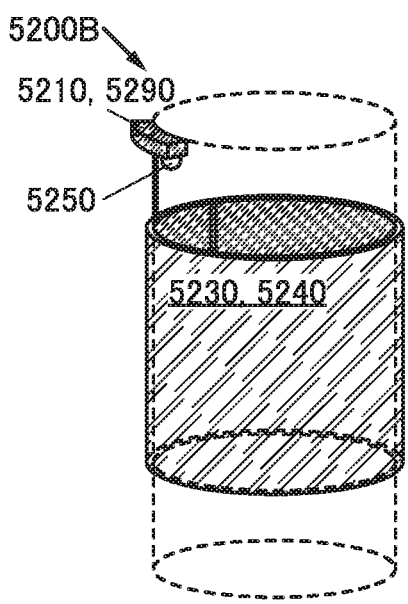

<<Structure Example 1 of Data Processing Device>>
For example, the display portion 5230 can have an outer shape along a cylindrical column (see FIG. 14(B)). The data processing device has a function of changing its display method in accordance with the illuminance of a usage environment. In addition, the data processing device has a function of changing the displayed content in response to sensed existence of a person. This allows the data processing device to be provided on a column of a building, for example. The data processing device can display advertising, guidance, or the like. The data processing device can be used for digital signage or the like.

Figure 14C:
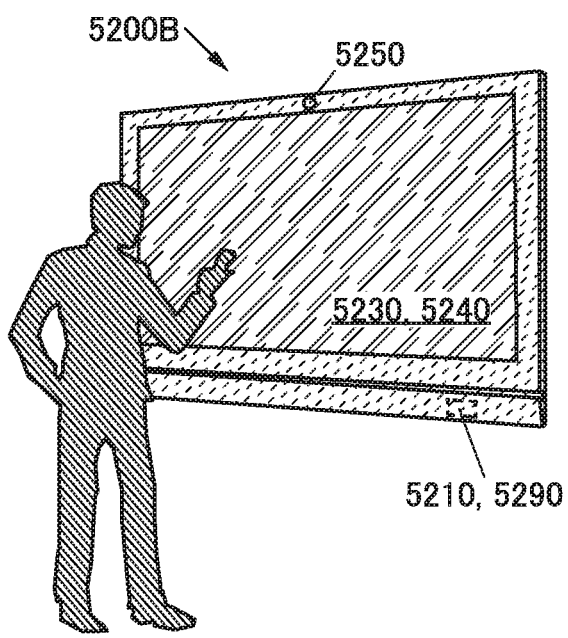

<<Structure Example 2 of Data Processing Device>>
For example, the data processing device has a function of generating image data on the basis of the path of a pointer used by a user (see FIG. 14(C)). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

Figure 14D:
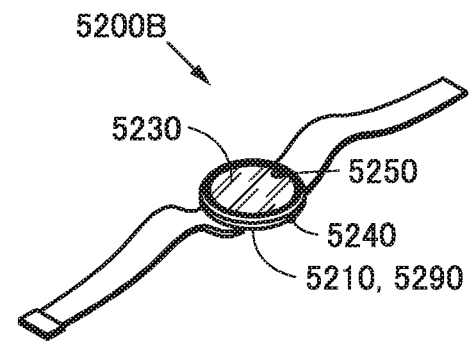

<<Structure Example 3 of Data Processing Device>>
For example, the data processing device has a function of changing its display method in accordance with the illuminance of a usage environment (see FIG. 14(D)). Thus, for example, the power consumption of a smartwatch can be reduced. Alternatively, for example, a smartwatch can display an image so as to be suitably used even in an environment under strong external light, e.g., outdoors in fine weather.

Figure 14E:
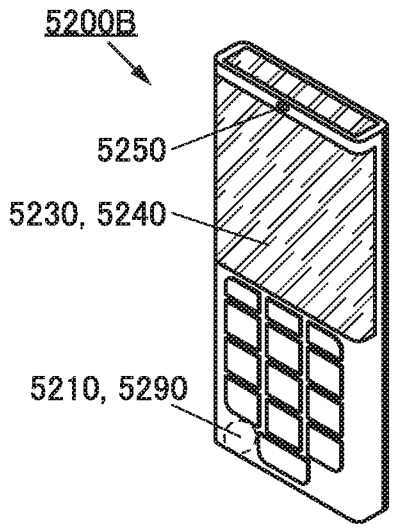

<<Structure Example 4 of Data Processing Device>>
For example, the display portion 5230 has a surface gently curved along a side surface of a housing (see FIG. 14(E)). The display portion 5230 includes a display panel that can display an image on the front surface, the side surfaces, and the top surface, for example. Thus, for example, a mobile phone can display image data not only on its front surface but also on its side surfaces and top surface.

Figure 15A:
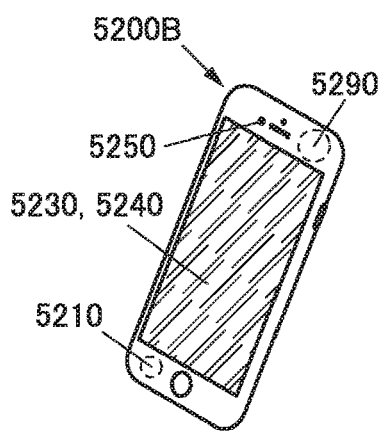
FIGS. 15A-15E Views showing a data processing device of an embodiment.

<<Structure Example 5 of Data Processing Device>>
For example, the data processing device has a function of changing its display method in accordance with the illuminance of a usage environment (see FIG. 15(A)). Thus, the power consumption of a smartphone can be reduced. Alternatively, for example, a smartphone can display an image so as to be suitably used even in an environment under strong external light, e.g., outdoors in fine weather.

Figure 15B:
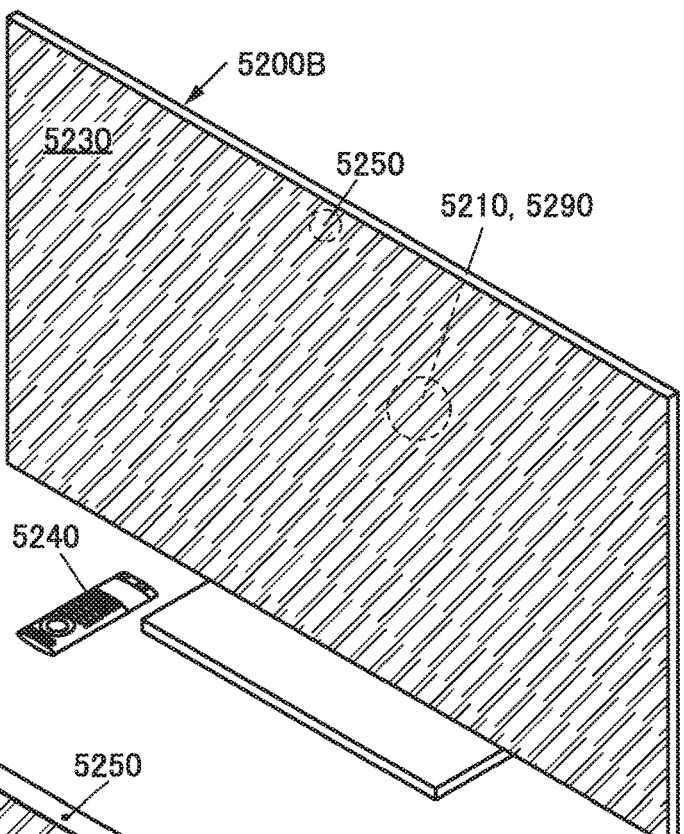

<<Structure Example 6 of Data Processing Device>>
For example, the data processing device has a function of changing its display method in accordance with the illuminance of a usage environment (see FIG. 15(B)). Accordingly, for example, a television system can display an image in such a manner that the television system can be suitably used even when irradiated with strong external light that enters the room from the outside in fine weather.

Figure 15C:
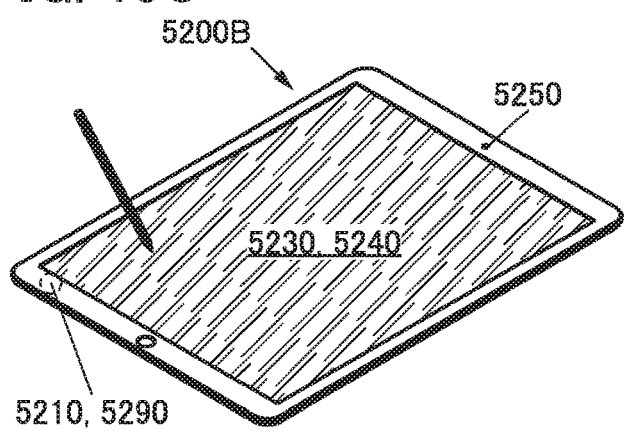

<<Structure Example 7 of Data Processing Device>>
For example, the data processing device has a function of changing its display method in accordance with the illuminance of a usage environment (see FIG. 15(C)). Thus, for example, a tablet computer can display an image so as to be suitably used even in an environment under strong external light, e.g., outdoors in fine weather.

Figure 15D:
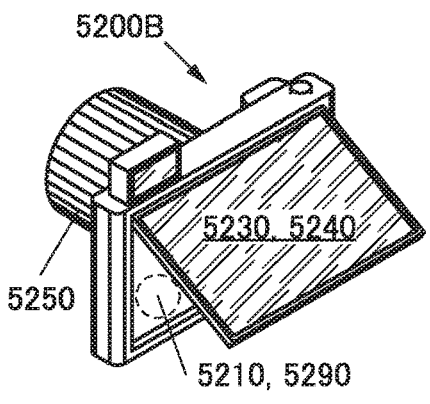

<<Structure Example 8 of Data Processing Device>>
For example, the data processing device has a function of changing its display method in accordance with the illuminance of a usage environment (see FIG. 15(D)). Accordingly, for example, a digital camera can display a subject in such a manner that an image is favorably viewed even in an environment under strong external light, e.g., outdoors in fine weather.

Figure 15E:
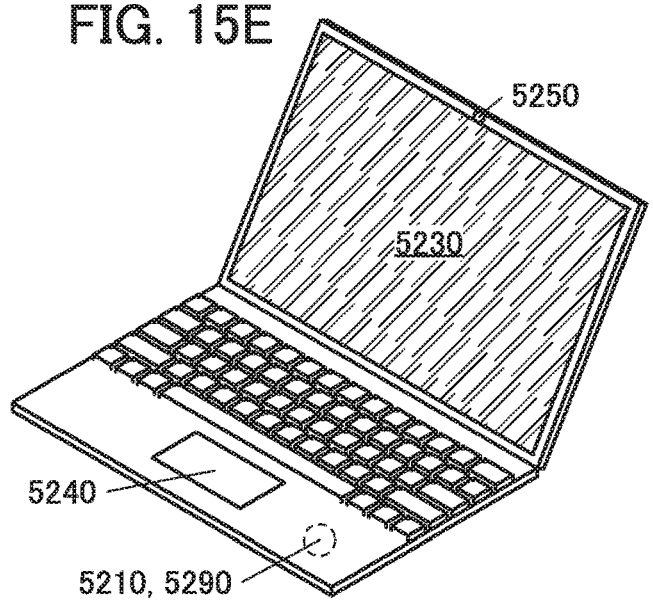

<<Structure Example 9 of Data Processing Device>>
For example, the data processing device has a function of changing its display method in accordance with the illuminance of a usage environment (see FIG. 15(E)). Accordingly, for example, a personal computer can display an image so as to be suitably used even in an environment under strong external light, e.g., outdoors in fine weather.

Note that this embodiment can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Still another example of the expression is "a source (or a first terminal or the like) of a transistor is electrically connected to X through Z1 by at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 by at least a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

C11: capacitor, C12: capacitor, CI: control data, DC21: driver circuit, DC22: driver circuit, DC23: driver circuit, DS: sensing data, G1 (i): scan line, G2(i): scan line, GCLK: signal, GDA: driver circuit, GDB: driver circuit, GDC: driver circuit, GD: driver circuit, II: input data, IN: data, KB1: structure body, LV1: level, LV2: level, LV3: level, LV4: level, LV5: level, LV6: level, N1(i, j): node, S1(j): signal line, S2(j): signal line, SD: driver circuit, SP: control signal, SW11: switch, SW12: switch, P1: positional data, PWC1: signal, PWC2: signal, V1: image data, V11: data, VCOM: potential, VN: potential, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 248: control portion, 250: sensing portion, 290: communication portion, 504: conductive film, 506: insulating film, 508: semiconductor film, 512A: conductive film, 512B: conductive film, 520: functional layer, 530: pixel circuit, 591A: connection portion, 700: display panel, 700TP: input/output panel, 702: pixel, 720: functional layer, 750: display element, 751: electrode, 752: electrode, 753: layer, 770: substrate, 770D: functional film, 770P: functional film, 771: insulating film, 775: sensing element, 5200B: data processing device, 5210: arithmetic device, 5220: input/output device, 5230: display portion, 5240: input portion, 5250: sensing portion, 5290: communication portion

The invention claimed is:

1. A display panel comprising a pixel and a first driving portion,
    wherein the pixel includes a pixel circuit and a display element,
    wherein the pixel circuit includes a first switch, a node, a capacitor, and a second switch,
    wherein the first switch includes a first terminal to which a first signal is supplied,
    wherein the first switch includes a second terminal electrically connected to the node,
    wherein the capacitor includes a first terminal electrically connected to the node,
    wherein the second switch includes a first terminal to which a second signal is supplied,
    wherein the second switch includes a second terminal electrically connected to a second terminal of the capacitor,
    wherein the second switch is configured to change from a non-conducting state to a conducting state when the first switch is in a non-conducting state,
    wherein the second switch is configured to change from a conducting state to a non-conducting state when the first switch is in a non-conducting state,
    wherein the display element performs display on the basis of a potential of the node,
    wherein the first driving portion supplies a first selection signal and a second selection signal,
    wherein the first selection signal changes from a second level to a first level in a period when the second selection signal is at a fourth level,
    wherein the second selection signal changes from the fourth level to a third level twice or more in a period when the first selection signal is at the first level,
    wherein the first switch is controlled on the basis of the first selection signal,
    wherein the first switch is brought into a conducting state when the first selection signal is at the second level,
    wherein the first switch is brought into a non-conducting state when the first selection signal is at the first level,
    wherein the second switch is controlled on the basis of the second selection signal,
    wherein the second switch is brought into a conducting state when the second selection signal is at the fourth level, and
    wherein the second switch is brought into a non-conducting state when the second selection signal is at the third level.

2. The display panel according to claim 1, further comprising a second driving portion,
    wherein the second driving portion supplies the first signal and the second signal,
    wherein the second signal includes a first potential and a second potential,
    wherein the second signal changes from the first potential to the second potential or from the second potential to the first potential when the first selection signal is at the first level and the second selection signal is at the fourth level, and
    wherein the potential of the node changes on the basis of a potential difference between the first potential and the second potential and the first signal.

3. The display panel according to claim 2,
    wherein the second driving portion includes a first driver circuit and a second driver circuit,
    wherein the first driver circuit generates the first signal, and
    wherein the second driver circuit generates the second signal.

* * * * *